United States Patent [19]
Omura et al.

[11] Patent Number: 6,037,632
[45] Date of Patent: Mar. 14, 2000

[54] SEMICONDUCTOR DEVICE

[75] Inventors: Ichiro Omura, Zurich, Switzerland; Tomoki Inoue, Tokyo; Hiromichi Ohashi, Yokohama, both of Japan

[73] Assignee: Kabushiki Kaisha Toshiba, Kawasaki, Japan

[21] Appl. No.: 08/744,212

[22] Filed: Nov. 5, 1996

[30] Foreign Application Priority Data

Nov. 6, 1995 [JP] Japan .................................. 7-287182

[51] Int. Cl.$^7$ ............................ H01L 29/74; H01L 29/76; H01L 23/58
[52] U.S. Cl. ........................ 257/341; 257/139; 257/401; 257/490; 257/495
[58] Field of Search .................................... 257/139, 147, 257/341, 401, 490, 491, 492, 495, 496

[56] References Cited

U.S. PATENT DOCUMENTS

| | | | |
|---|---|---|---|
| 4,422,089 | 12/1983 | Yaes et al. ................................ | 257/492 |
| 5,132,769 | 7/1992 | Kekura ..................................... | 257/496 |
| 5,177,572 | 1/1993 | Murakami ................................ | 257/330 |
| 5,438,215 | 8/1995 | Tihanyi ..................................... | 257/341 |
| 5,488,236 | 1/1996 | Baliga et al. ............................ | 257/332 |
| 5,510,634 | 4/1996 | Okabe et al. ............................ | 257/491 |
| 5,572,048 | 11/1996 | Sugawara ................................ | 257/139 |

OTHER PUBLICATIONS

Jun–ichi Nishizawa, et al. "Field–Effect Transistor Versus Analog Transistor (Static Induction Transistor)", IEEE Transactions On Electron Devices, (pp. 185–197), Apr., 1975, vol. ED–22 No. 4.

Michael S. Adler, et al. "Theory and Breakdown Voltage for Planar Devices with a Single Field Limiting Ring", IEEE Transactions On Electron Devices, (pp. 107–113), Feb., 1977, vol. ED–24 No. 2.

*Primary Examiner*—Tom Thomas
*Assistant Examiner*—Ori Nadav
*Attorney, Agent, or Firm*—Oblon, Spivak, McClelland, Maier & Neustadt, P.C.

[57] ABSTRACT

A semiconductor device is disclosed, which comprises a first main electrode, a second main electrode, a high-resistance semiconductor layer of first conductivity type interposed between the first main electrode and the second main electrode, and at least a buried layer of second conductivity type selectively formed in the semiconductor layer, extending at substantially right angles to a line connecting the first and second main electrodes, comprising a plurality strips functioning as current paths and set at a potential different from a potential of any other electrode when a depletion layer extending from a region near the first main electrode reaches the buried layer.

3 Claims, 23 Drawing Sheets

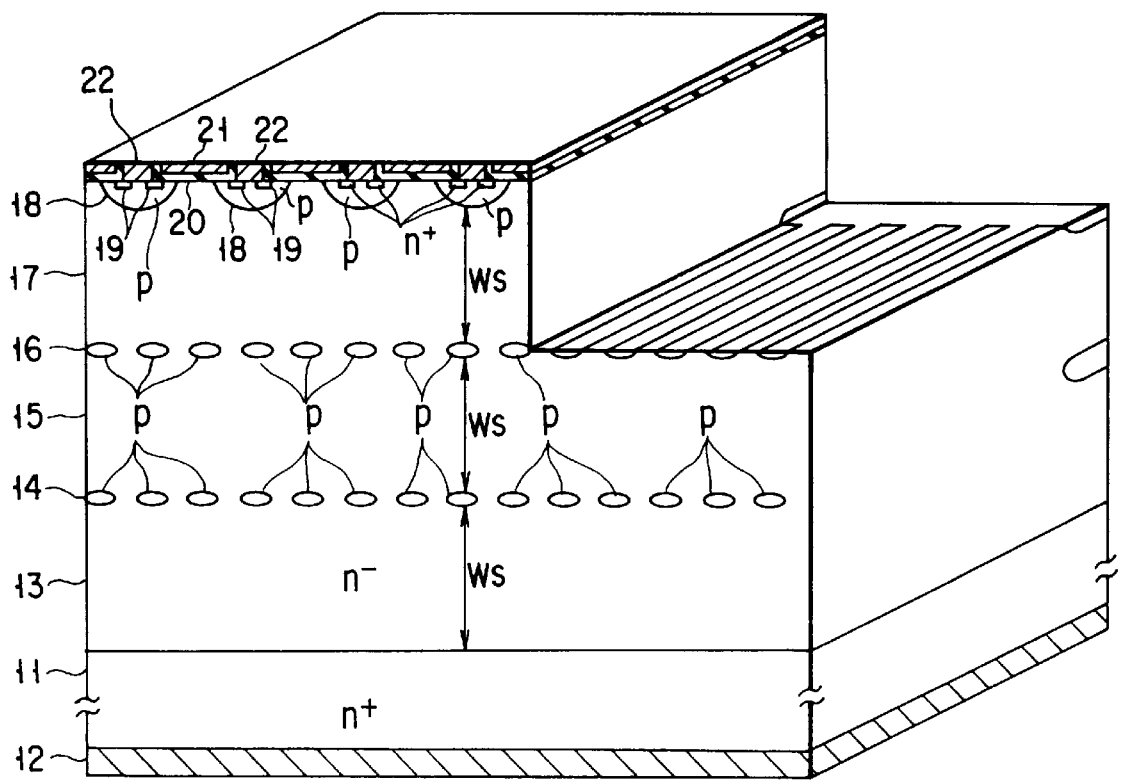
F I G. 6
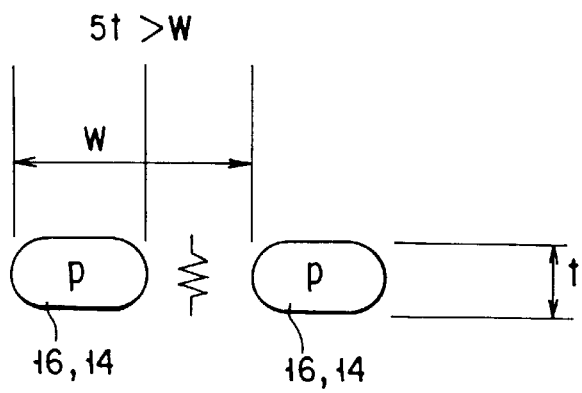
F I G. 7

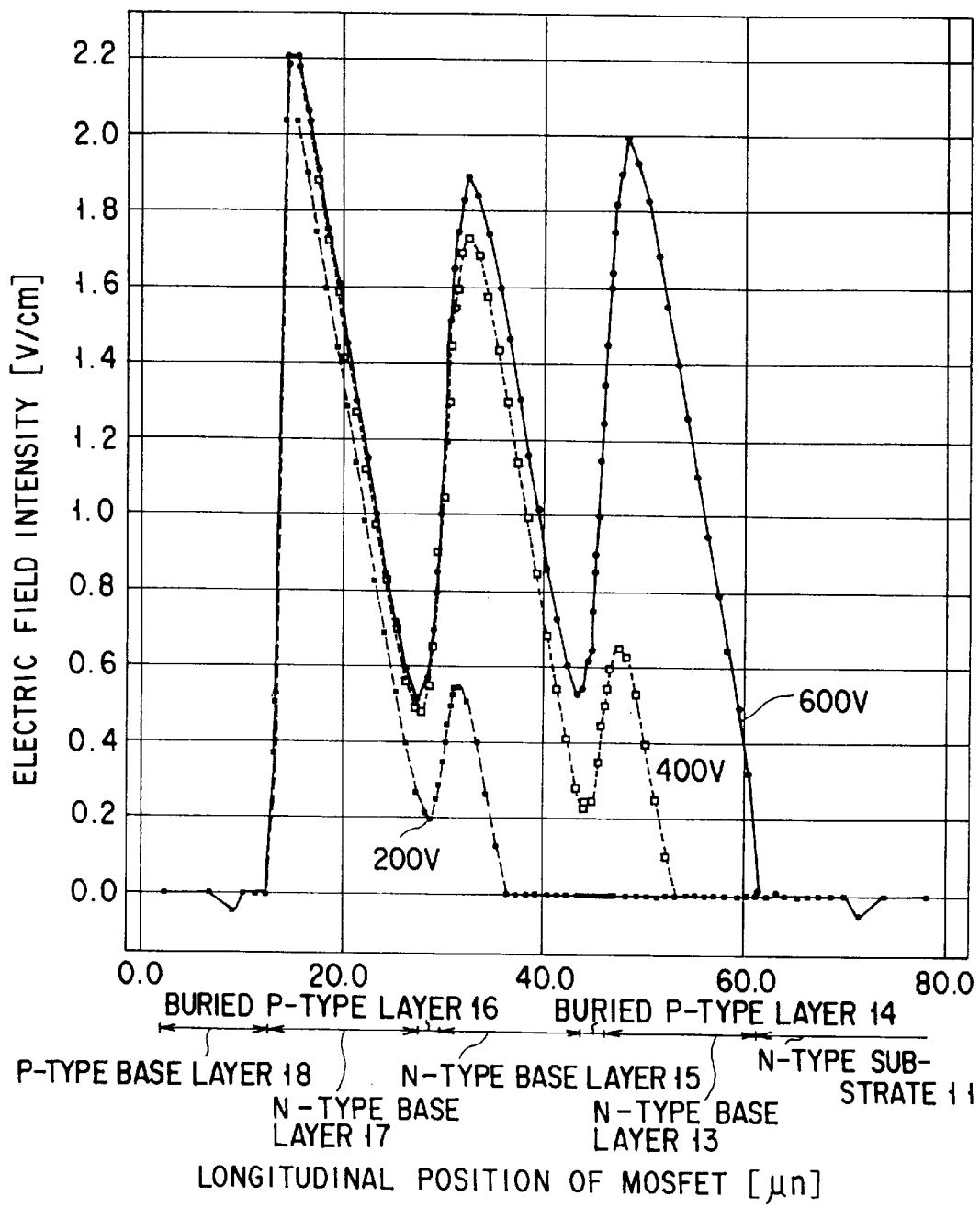
F I G. 9

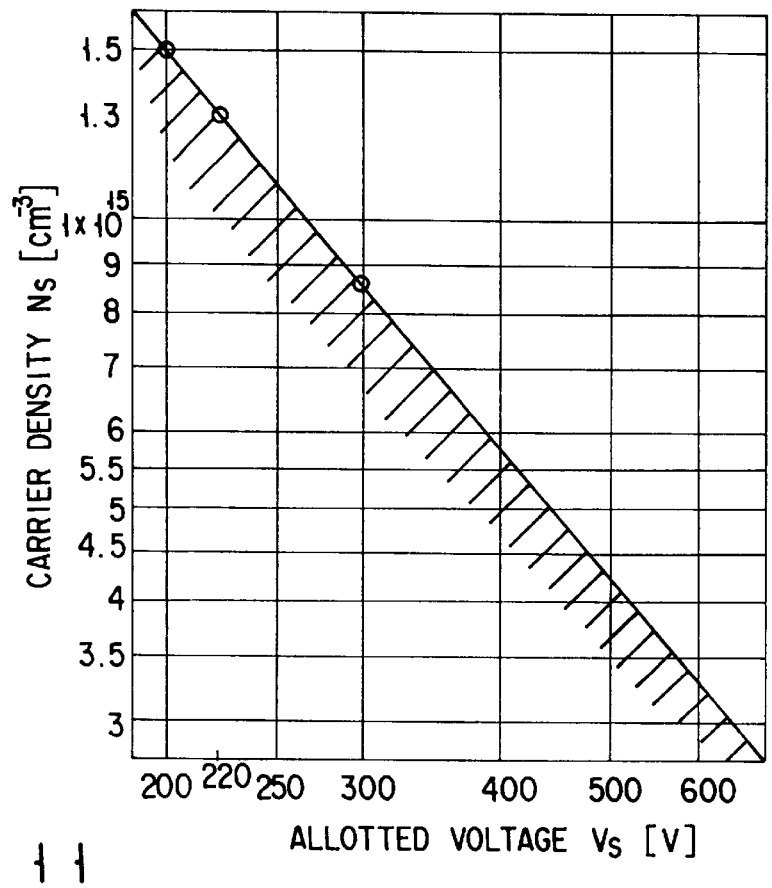
F I G. 11
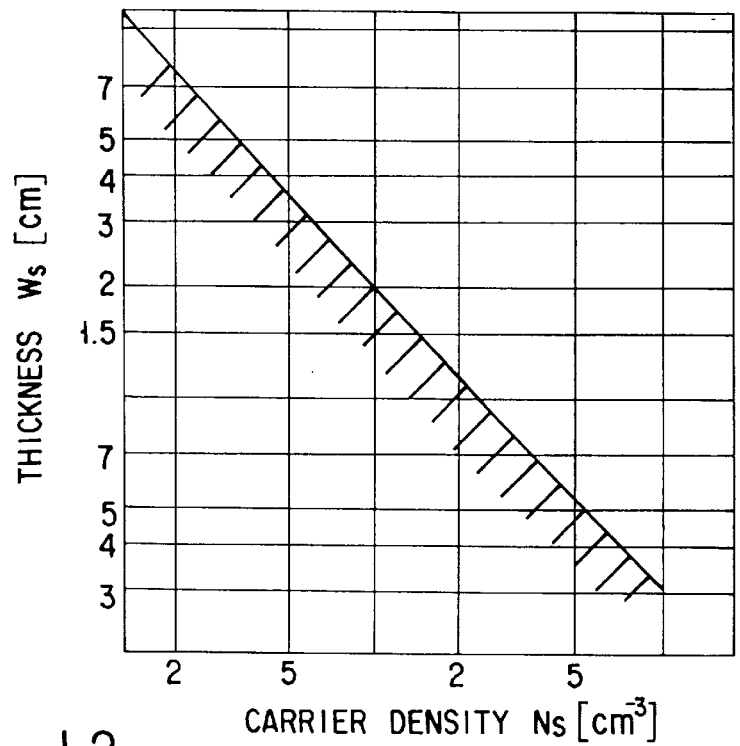
F I G. 12

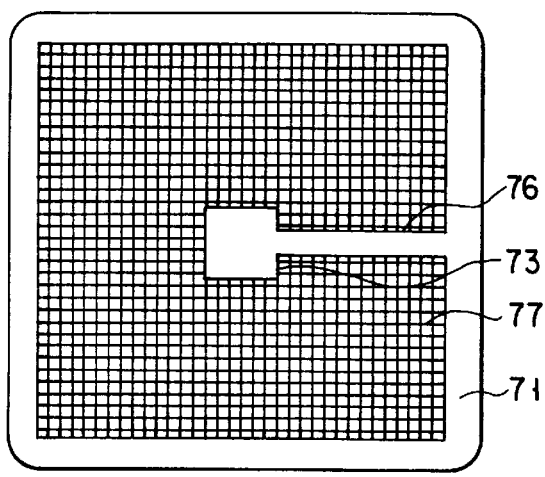
F I G. 30
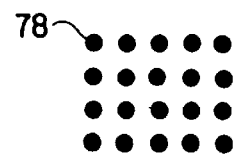
F I G. 31
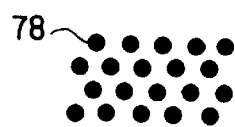
F I G. 32
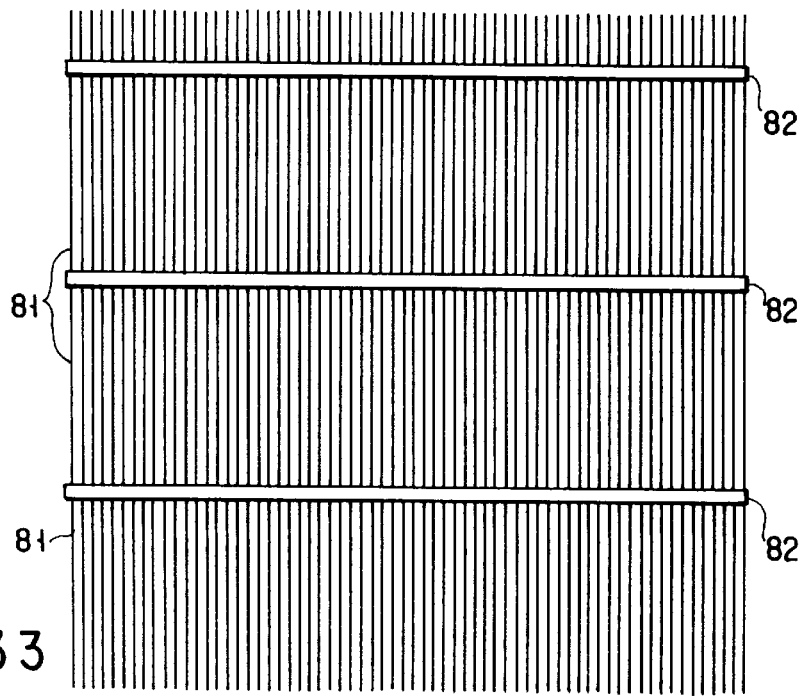
F I G. 33
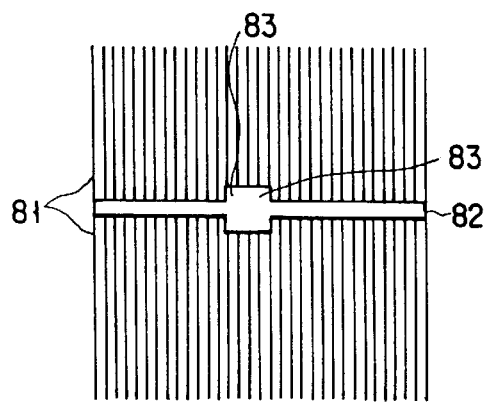
F I G. 34

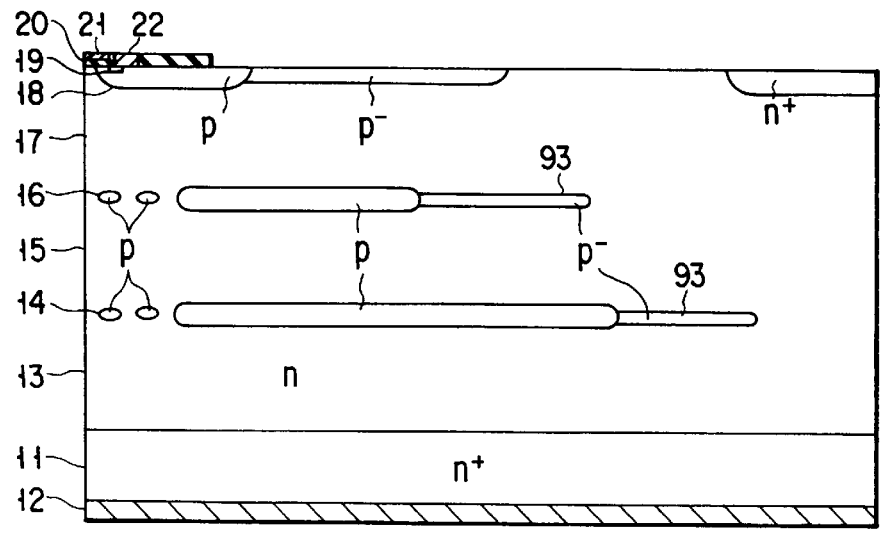
F I G. 37
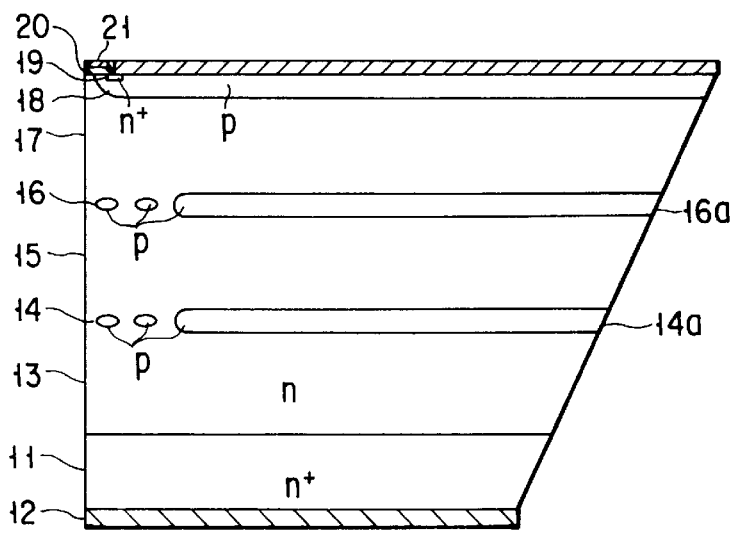
F I G. 38
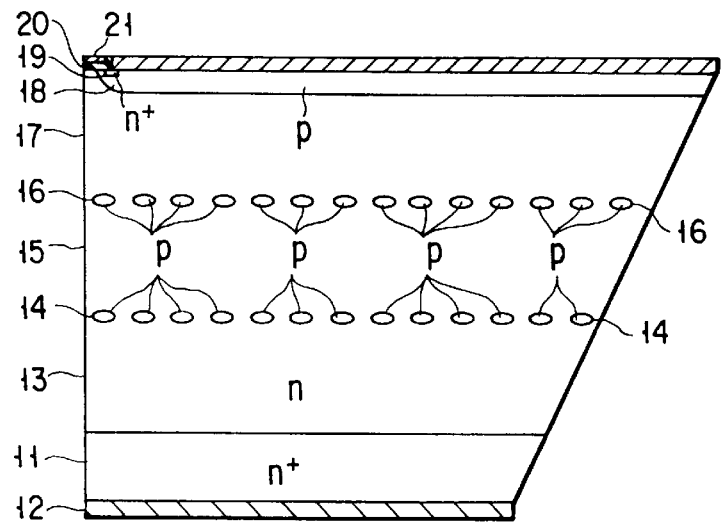
F I G. 39

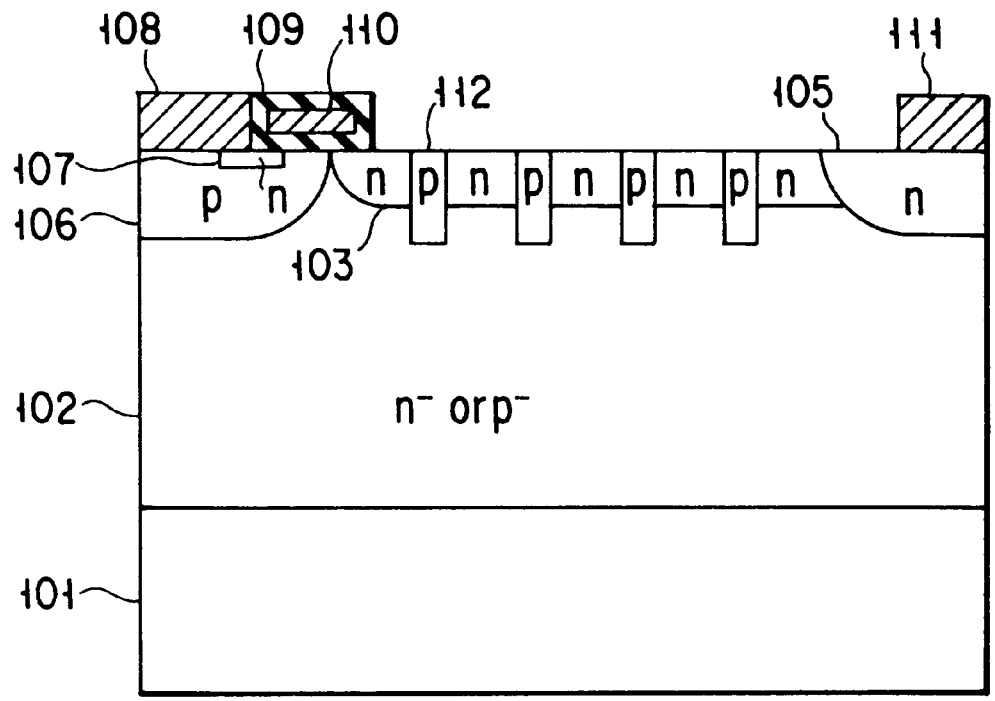
F I G. 43
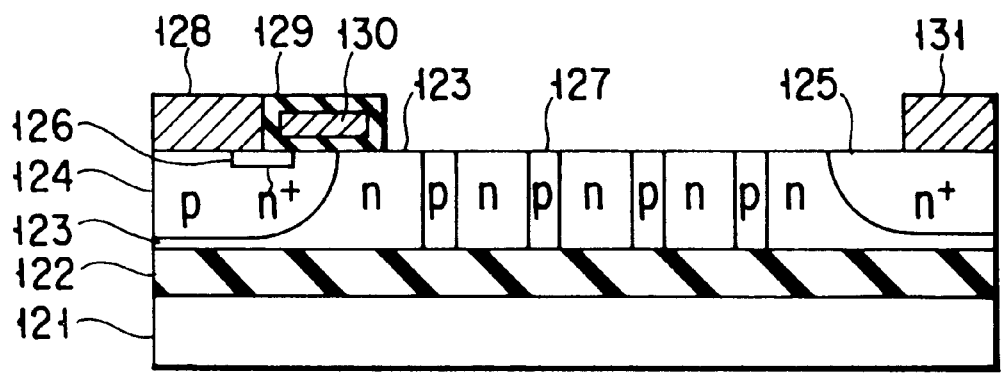
F I G. 44

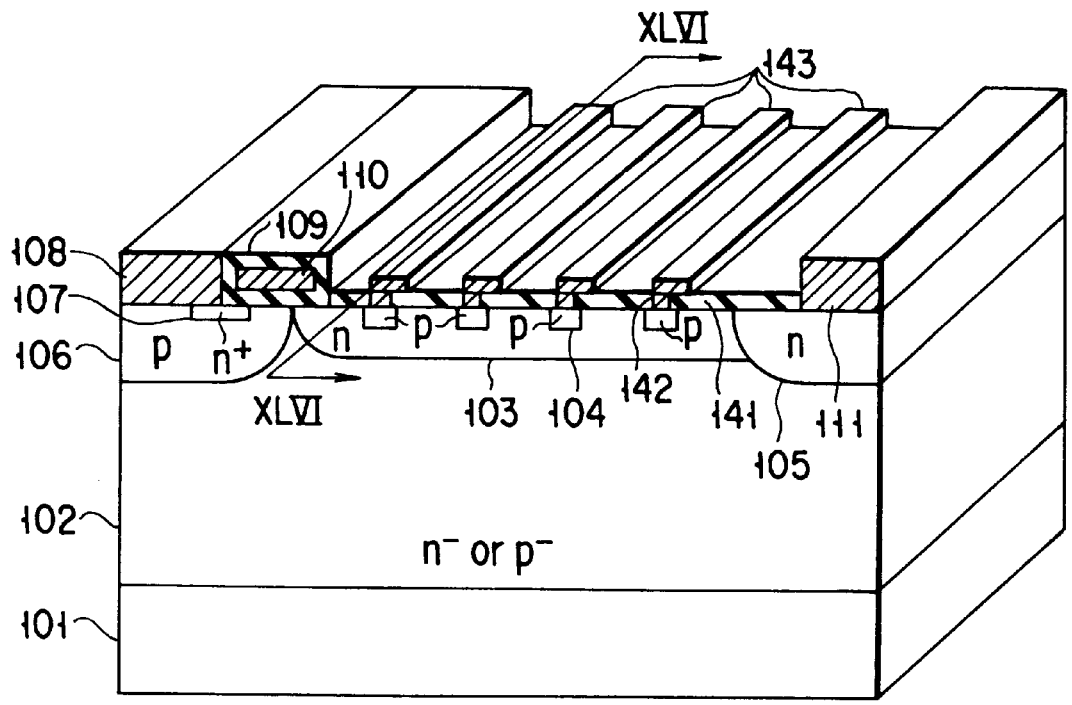
F I G. 45
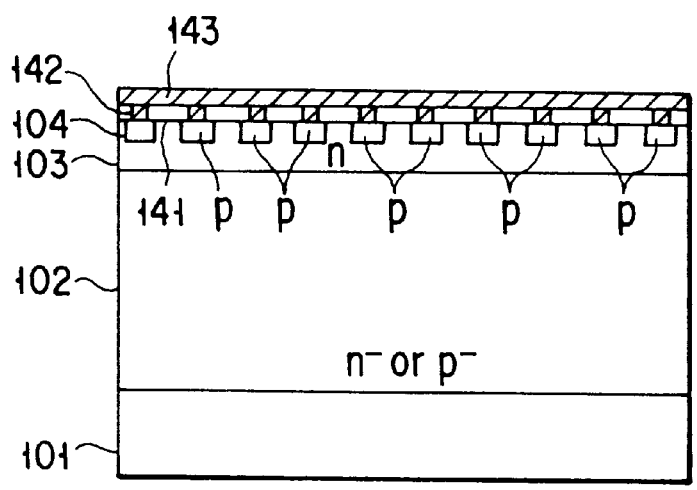
F I G. 46

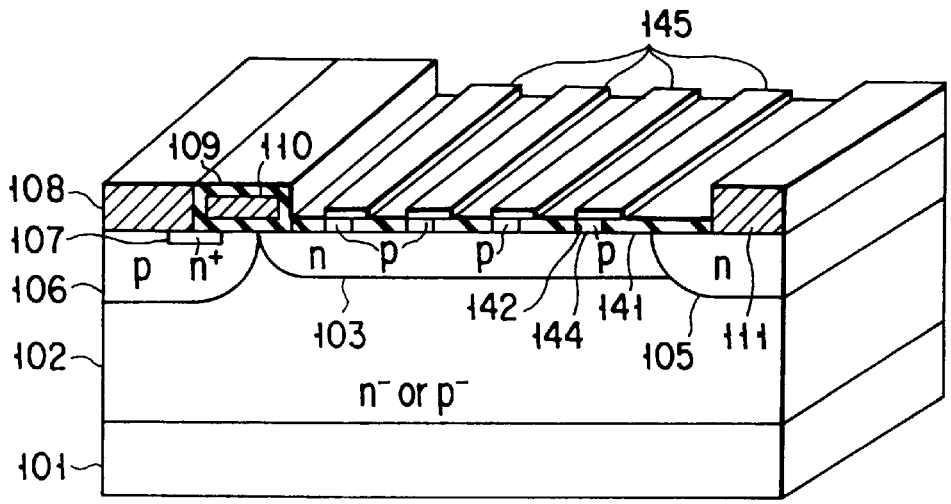
F I G. 47
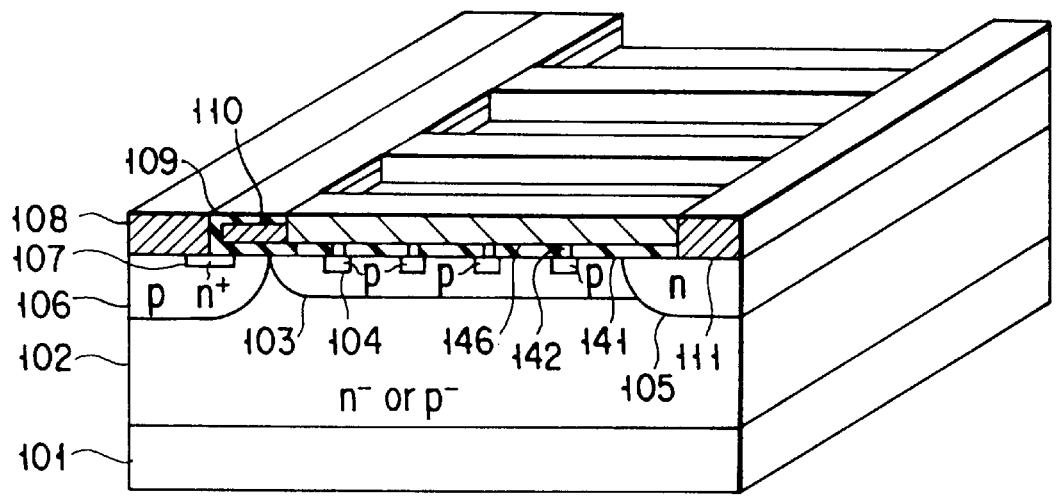
F I G. 48

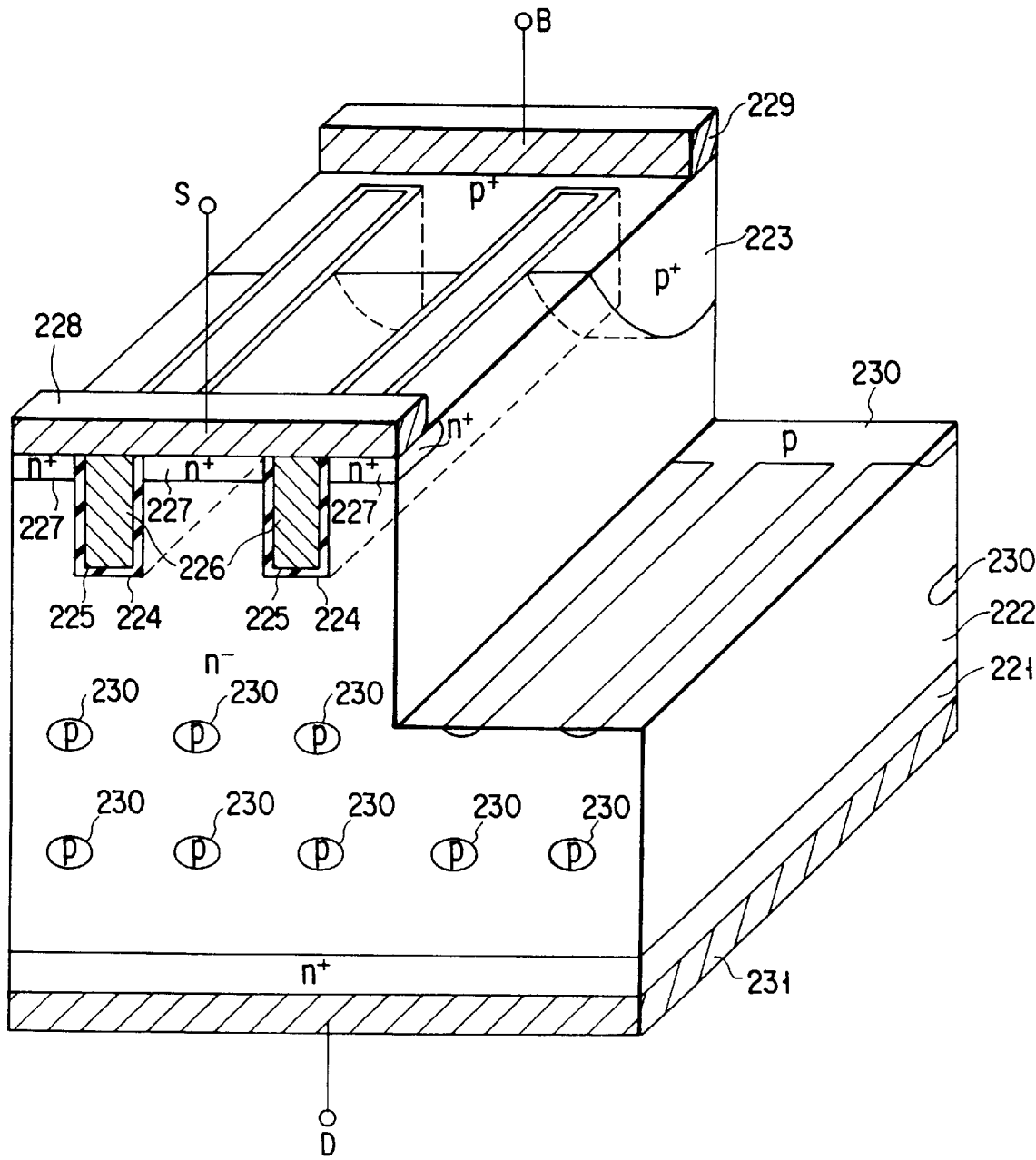
F I G. 53

SEMICONDUCTOR DEVICE

BACKGROUND OF THE INVENTION

1. Field of the Invention

The present invention relates to a semiconductor device used for high-power control, and more in particular to a semiconductor device capable of reducing an on-state voltage drop.

2. Description of the Related Art

In recent years, the Si MOSFET has been widely used as a semiconductor device for high-power control. This MOSFET is a unipolar device and has various advantages including high speed, ease to control, etc.

FIG. 1 is a diagram schematically showing a configuration of this type of MOSFET. This MOSFET comprises an n-type substrate 301 constituting an n-type drain layer, an n-type base layer 302 formed on the n-type substrate 301, a plurality of p-type base layers 303 selectively formed by diffusion in the surface of the n-type base layer 302, and n-type source layers 304 selectively formed in the surface of each p-type base layer 303.

A gate electrode 306 is formed through a gate insulating film 305 in a region extending from a first p-type base layer 303 and an associated n-type source layer 304 through the n-type base layer 302 to a second p-type base layer 303 and an associated n-type source layer 304. Also, a source electrode 307 is formed on each set of the p-type base layer 303 and the n-type source layer 304 in such a position as to hold a gate electrode 306 between each two sets.

Further, the surface of the n-type substrate 301 far from the n-type base layer 302 is formed with a drain electrode 308.

This MOSFET is a unipolar device contributing to the conduction of a type of carriers. If the resistance of the MOSFET is to be reduced, therefore, the impurities concentration of the n-type base layer 302 is required to be increased to decrease the resistivity thereof and also to decrease the thickness of the n-type base layer 302.

With the increase in the impurities concentration of the n-type base layer 302, however, the maximum intensity value of the electric field formed just under the p-type base layer 303 with the MOSFET off increases. As a result, in the MOSFET, the impurities concentration in the n-type base layer 302 is required to be suppressed in order for the maximum value of the electric field intensity not to exceed a critical level of the electric field intensity of the n-type base layer 302. Also, the breakdown voltage of the MOSFET is determined by the total amount of impurities in the n-type base layer 302. When the breakdown voltage is to be increased, therefore, the n-type base layer 302 is thickened. In the MOSFET of high breakdown voltage, therefore, the on-state voltage drop rapidly rises.

In short, in this type of MOSFET, an improved breakdown voltage and a lower on-resistance are desired. For increasing the breakdown voltage, the thickness W of the n-type base layer 302 is increased or the carrier density N of the n-type base layer 302 is reduced.

These methods, however, as shown by solid line in FIG. 2, have been theoretically found to undesirably increase the on-resistance about two orders of magnitude before improving the breakdown voltage an order of magnitude. In other words, the solid line in FIG. 2 indicates that there is a theoretical limit determined from the physical property of Si and that the MOSFET with a high breakdown voltage has a high on-resistance as compared with the IGBT or the like.

Now, explanation will be made sequentially about the bipolar transistor (hereinafter referred to as the BJT) and the IGBT used for power control like the MOSFET.

FIG. 3 is a sectional view schematically showing a configuration of a bipolar transistor. This BJT is such that an n-type base layer 312 is formed on an n-type substrate 311 as an n-type collector layer. The surface of the n-type base layer 312 is selectively formed with a p-type base layer 313 by diffusion. The surface of the p-type base layer 313, in turn, is selectively formed with an n-type emitter layer 314. A base electrode 315 is formed on the p-type base layer 313. An emitter electrode 316 is formed on the n-type emitter layer 314.

Also, the surface of the n-type base layer 311 far from the n-type base layer 312 is formed with a collector electrode 317.

In this BJT, a large proportion of the current flowing in the n-type base layer 312 is due to electrons. Like in the MOSFET, therefore, the on-state voltage drop rapidly increases undesirably with the increase in the breakdown voltage.

On the other hand, an attempt has been made to reduce the on-state voltage drop by making a high-resistance n-type base layer a high injection state like the IGBT.

FIG. 4 is a sectional view schematically showing a configuration of an IGBT. In this IGBT, a plurality of p-type base layers 322 are selectively formed in the surface of a high-resistance n-type base layer 321. The surface of each p-type base layer 322 is formed selectively with n-type source layers 323 by diffusion. A gate electrode 325 is formed through a gate insulating film 324 in a region extending from a first p-type base layer 322 with an n-type source layer 323 to a second p-type base layer 322 through the n-type base layer 321. Also, a source electrode 326 is formed on each p-type base layer 322 with the n-type source layers 323 in such a manner that each two adjacent source electrodes 326 hold a gate electrode 325 therebetween. Also, a drain electrode 328 is formed on the reverse side of the n-type source layer 321 through a p-type drain layer 327.

Upon application of a positive voltage to the gate electrode 325 of this IGBT, the portion of the p-type source layer 322 under the gate electrode 325 is formed with an n-type inversion layer thereby to short the n-type base layer 321 and the n-type source layer 323 to each other. Consequently, electrons are injected into the n-type base layer 321, and holes are injected from the p-type drain layer 327 in accordance with the amount of electrons thus injected, so that the n-type base layer 321 becomes a high injection state thereby to turn on the IGBT. When the IGBT is in on state, the n-type base layer 321 becomes a high injection state. Even when the n-type base layer 321 has a high resistivity, therefore, the resistance of the IGBT is low.

A current does not flow in the IGBT, however, unless a voltage higher than the diffusion potential difference between the n-type base layer 321 and the p-type drain layer 327 is applied between the source electrode 326 and the drain electrode 328. As shown in FIG. 5, therefore, the on-state voltage drop of this IGBT is higher than that of the MOSFET, and a conduction loss of the IGBT is increasing, when the current value is low.

More specifically, with the increase in breakdown voltage, the MOSFET or BJT poses the problem of an on-state voltage drop rising with higher rapidity. The IGBT, on the other hand, has the problem of a larger conduction loss caused with a lower current state.

SUMMARY OF THE INVENTION

The object of the present invention is to provide a semiconductor device capable of reducing the on-state voltage drop with a high breakdown voltage.

In order to achieve the above-mentioned object, according to a first aspect of the present invention, there is provided a first semiconductor device comprising a first main electrode, a second main electrode, a high-resistance semiconductor layer of first conductivity type interposed between the first main electrode and the second main electrode, a buried layer of second conductivity type selectively formed in the semiconductor layer, extending at substantially right angles to a line connecting the first and second main electrodes, comprising a plurality strips functioning as current paths and set at a potential different from a potential of any other electrode when a depletion layer extending from a region near the first main electrode reaches the buried layer.

In off state, the depletion layer expands from a region near the first main electrode to the second main electrode in the semiconductor layer of first conductivity type in proportion to the increase in an applied voltage. When this depletion layer reaches the potential fixing layer of second conductivity type, a punch-through phenomenon causes the potential fixing layer of second conductivity type to fix the electric field intensity in the depletion layer and suppresses the increase thereof. The impurities concentration of the semiconductor layer of first conductivity type is increased to reduce the on-resistance in a range including a critical value of electric field intensity exceeding the maximum value of the suppressing electric field intensity. In this way, the on-state voltage drop can be reduced with a high breakdown voltage.

According to a second aspect of the invention, there is provided a second semiconductor device comprising a first main electrode, a second main electrode, a high-resistance semiconductor layer of first conductivity type interposed between the first main electrode and the second main electrode, a current control structure formed in contact with the semiconductor layer and having a control electrode for controlling the current flowing from the first main electrode to the second main electrode; and a buried layer of second conductivity type selectively formed in the semiconductor layer, extending at substantially right angles to a line connecting the first and second main electrodes and comprising a plurality strips functioning as current paths.

In addition to the effects of the first semiconductor device, the current control structure can control the current flowing from the first main electrode to the second main electrode.

According to a third aspect of the invention, there is provided a third semiconductor device comprising a drain layer, a drain electrode formed on a surface of the drain layer, a high-resistance semiconductor layer of first conductivity type formed on a surface of the drain layer, which faces away from the drain electrode, a base layer of second conductivity type formed selectively in a surface of the semiconductor layer, which faces away from the drain layer, a source layer of first conductivity type formed selectively in the surface of the base layer of second conductivity type, a source electrode formed on the source layer of first conductivity type and the base layer of second conductivity type, a gate electrode in contact with the source layer of first conductivity type, the base layer of second conductivity type and the semiconductor layer of first conductivity type through a gate insulating film, and a buried layer of second conductivity type selectively formed in the semiconductor layer, extending at substantially right angles to a line connecting the drain electrode and the source electrode and comprising a plurality strips functioning as current paths.

In off state, the depletion layer expands from the base layer of second conductivity type to the drain electrode in proportion to the increase in an applied voltage. When this depletion layer reaches the potential fixing layer of second conductivity type, a punch-through phenomenon causes the potential fixing layer of second conductivity type to fix the electric field intensity in the depletion layer and suppress the increase thereof. The impurities concentration of the semiconductor layer of first conductivity type is increased thereby to reduce the on-resistance in a range including a critical value of the electric field intensity exceeding the maximum value of the suppressing electric field intensity. The on-state voltage drop can thus be reduced with a high breakdown voltage.

A semiconductor device has a gate insulating film and a gate electrode, the gate insulating film and the gate electrode are formed in a groove extending through the base layer and reaching to halfway the depth of the semiconductor layer.

The potential fixing layer of second conductivity type may be have a meshy structure.

In other words, in the case where the buried layer of second conductivity type has a meshy structure, the breakdown voltage can be easily increased as compared with a striped type.

Also, the buried layer of second conductivity type may alternatively be striped.

The drain layer may be of second conductivity type.

Even with a bipolar device having a drain layer of second conductivity type on the drain electrode side thereof, the on-state voltage drop can be reduced with a high breakdown voltage in the same manner as described above.

The drain layer may be of first conductivity type. In this case, a MOSFET or the like with the on-state voltage drop capable of being reduced can be fabricated with a high breakdown voltage.

The potential fixing layer of second conductivity type may have a plurality of gaps providing a current path and may be formed in the semiconductor layer of first conductivity type.

According to first or second aspect of the invention, there may be provided a semiconductor device holding the following relations:

$$Vs=(BV-V_1-V_2)/(M-1)[V]$$

$$V_1 \geq Vs$$

$$V_2 \geq Vs$$

$$N_1 < 1.897 \times 10^{18} \times V_1^{-1.35} [\text{cm}^{-3}]$$

$$N_2 < 1.897 \times 10^{18} \times V_{2-1.35} [\text{cm}^{-3}]$$

$$Ns < 1.897 \times 10^{18} \times Vs^{-1.35} [\text{cm}^{-3}]$$

$$W_1 < 1.1247 \times 10^{10} \times N_1^{-0.85} [\text{cm}]$$

$$Ws < 1.1247 \times 10^{10} \times Ns^{-0.85} [\text{cm}]$$

where BV is the breakdown voltage between the first and second main electrodes, M is the number of the buried layer between the first and second main electrodes, $V_1$ is the voltage allotted to those semiconductor layers separated into M+1 layers by the buried layer which are located near the first main electrode; $N_1$ is the impurities concentration of the semiconductor layer located near the first main electrode; $W_1$ is the thickness of the semiconductor layers located near the first main electrode; $V_2$ is the voltage allotted to those semiconductor layers (of first conductivity type) separated into M+1 layers by the buried layer which are located near the second main electrode; $N_2$ is the impurities concentration of the semiconductor layer located near the in second main electrode; Vs is the voltage allotted to those M−1 semiconductor layers separated into M+1 layers by the buried layer which are spaced from the first and second main electrodes, Ns is the impurities concentration of the M−1 semiconductor layers, and Ws is the thickness of the M−1 semiconductor layers.

Similarly, according to a third aspect of the invention, there may be provided a semiconductor device holding the following relations:

$Vs=V_2=(BV-V_1-V_2)/(M-1)[V]$ $V_1 \geq Vs$ $V_2 \geq V_2$ $N_1 < 1.897 \times 10^{18} \times V_1^{-1.35} [cm^{-3}]$ $N_2 < 1.897 \times 10^{18} \times V_{2-1.35} [cm^{-3}]$ $Ns < 1.897 \times 10^{18} \times Vs^{-1.35} [cm^{-3}]$ $W_1 < 1.1247 \times 10^{10} \times N_1^{-0.85} [cm]$ $Ws < 1.1247 \times 10^{10} \times Ns^{-0.85} [cm]$ where BV is the breakdown voltage between the source electrode and the drain electrode, M is the number of the buried layers of second conductivity type between the source electrode and the drain electrode, $V_1$ is the voltage allotted to each one of the M+1 semiconductor layers of first conductivity type in contact with the base layer of second conductivity type which M+1 base layers of first conductivity type are separated by the buried layers of second conductivity type, $N_1$ is the impurities concentration of the semiconductor layer of first conductivity type in contact with the base layer of second conductivity type, $W_1$ is the thickness of the semiconductor layer of first conductivity type in contact with the base layer of second conductivity type, $V_2$ is the voltage allotted to each one of the M+1 semiconductor layers of first conductivity type in contact with the drain layer which M+1 base layers of first conductivity type are separated by the buried layers of second conductivity type, $N_2$ is the impurities concentration of the semiconductor layer of first conductivity type in contact with the drain layer, Vs is the voltage allotted to each of those M−1 semiconductor layers of first conductivity type separated into M+1 layers by the buried layers of second conductivity type which are out of contact with the base layer of second conductivity type and the drain layer, Ns is the impurities concentration of the M−1 semiconductor layers of first conductivity type, and Ws is the thickness of the M−1 semiconductor layers of first conductivity type.

Since the design conditions are specifically determined by predetermined formulae in this way, a device which accurately operates can be formed with a high reproducibility.

According to a fourth aspect of the invention, there is provided a third semiconductor device comprising at least a guard ring region of second conductivity type formed substantially in a square to surround the potential fixing layer of second conductivity type.

In this terminal structure, each guard ring region of second conductivity type relaxes the electric field intensity by increasing the intervals of equipotential lines in the semiconductor device terminal, thereby preventing the deterioration of breakdown voltage of the terminal section.

Also, the third semiconductor device according to the invention may comprise a resurf region of second conductivity type formed substantially in a square to surround the potential fixing layer of second conductivity type and having a carrier density lower than that of the potential fixing layer of second conductivity type.

Further, in the third semiconductor device according to the invention, a terminal section of the semiconductor layer of first conductivity type may be formed in a bevel structure having an inclination.

The above-mentioned configuration leads to the advantage of a bevel structure relaxing the electric field intensity in the end surface of a pn junction.

The above and other objects, features and advantages will be made apparent by the detailed description taken in conjunction with the accompanying drawings, in which similar reference numerals designate equivalent component parts respectively.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6 is a diagram schematically showing a configuration of a MOSFET according to a first embodiment of the invention;

FIG. 7 is a diagram for explaining the dimensions of a buried p-type layer according to the same embodiment;

FIG. 9 is a diagram showing the result of a two-dimensional numerical calculation of the electric field intensity distribution according to the same embodiment;

FIG. 11 is a diagram for determining a carrier density Ns from an allotted voltage Vs according to the same embodiment;

FIG. 12 is a diagram for determining a thickness Ws from a carrier density Ns according to the same embodiment;

FIG. 30 is a plan view showing a mask pattern for forming a meshy buried p-type layer according to the invention;

FIG. 31 is a plan view showing a mask pattern for forming a dotted buried p-type layer according to the invention;

FIG. 32 is a plan view showing a modification of the pattern shown in FIG. 31;

FIG. 33 is a plan view showing a mask pattern of a striped buried p-type layer eliminating the requirement of positioning according to the invention;

FIG. 34 is a plan view showing a modification of the pattern of FIG. 33;

FIG. 37 is a diagram schematically showing a terminal structure of a MOSFET according to a ninth embodiment of the invention;

FIG. 38 is a diagram schematically showing a terminal structure of a MOSFET according to a tenth embodiment of the invention;

FIG. 39 is a diagram schematically showing a terminal structure of a MOSFET according to an 11th embodiment of the invention;

FIG. 43 is a plan view schematically showing a configuration of a MOSFET according to a 13th embodiment of the invention;

FIG. 44 is a diagram schematically showing a configuration of a MOSFET according to a 14th embodiment of the invention;

FIG. 45 is a diagram schematically showing a configuration of a MOSFET according to a 15th embodiment of the invention;

FIG. 46 is a sectional view taken in line XLVI—XLVI taken in FIG. 45;

FIG. 47 is a diagram schematically showing a configuration of a MOSFET according to a 16th embodiment of the invention;

FIG. 48 is a diagram schematically showing a configuration of a MOSFET according to a 17th embodiment of the invention;

FIG. 53 is a sectional perspective view schematically showing a configuration of a semiconductor device according to a 22nd embodiment of the invention.

DETAILED DESCRIPTION OF THE PREFERRED EMBODIMENTS

Figure 1:
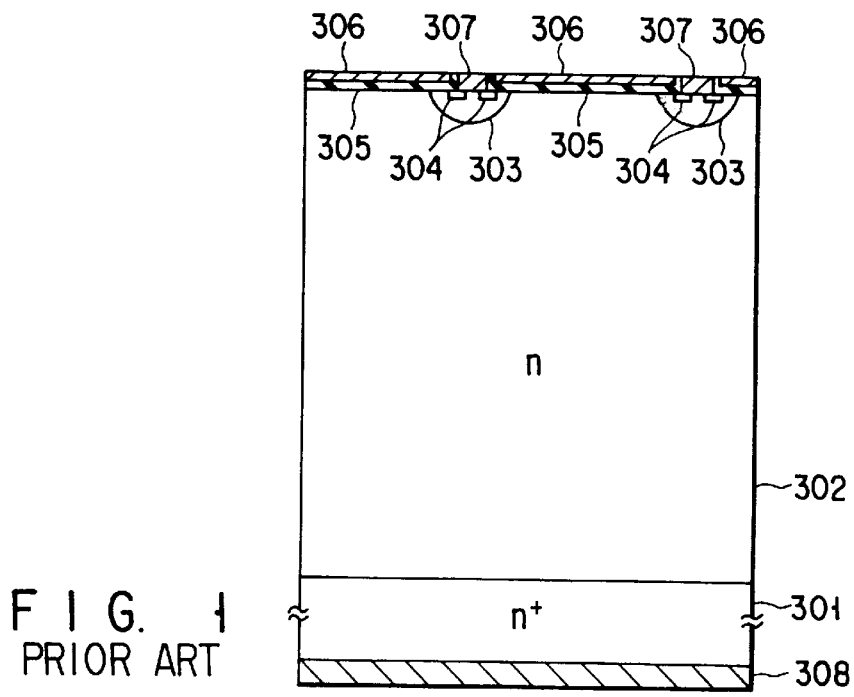
FIG. 1 is a diagram schematically showing a configuration of a conventional MOSFET.
Figure 2:
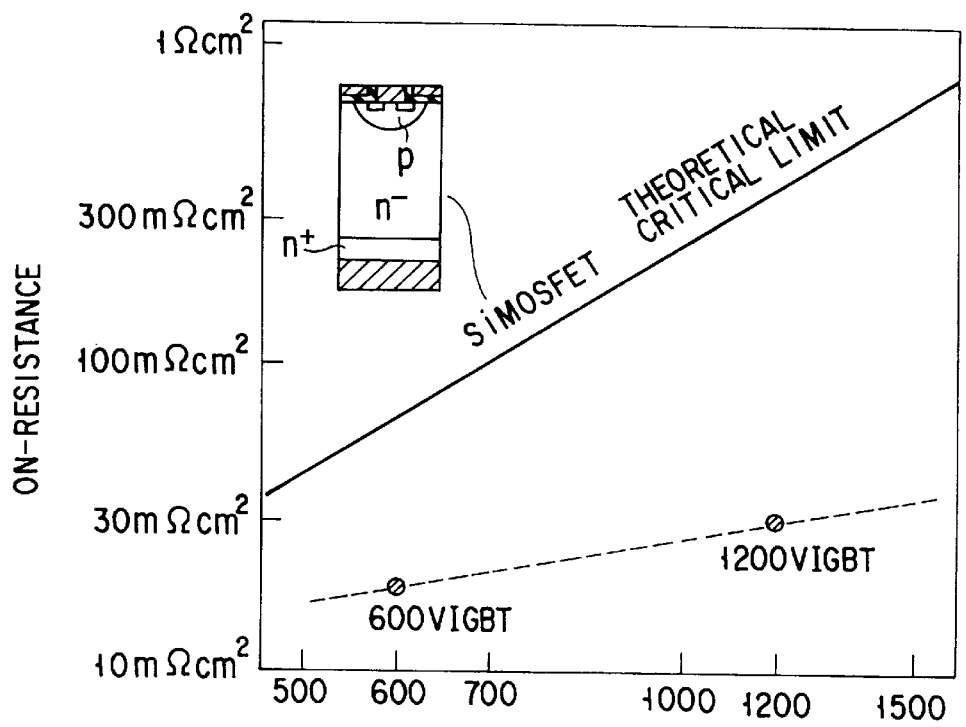
FIG. 2 is a diagram showing the relation between on-resistance and breakdown voltage of a conventional MOSFET.
Figure 3:
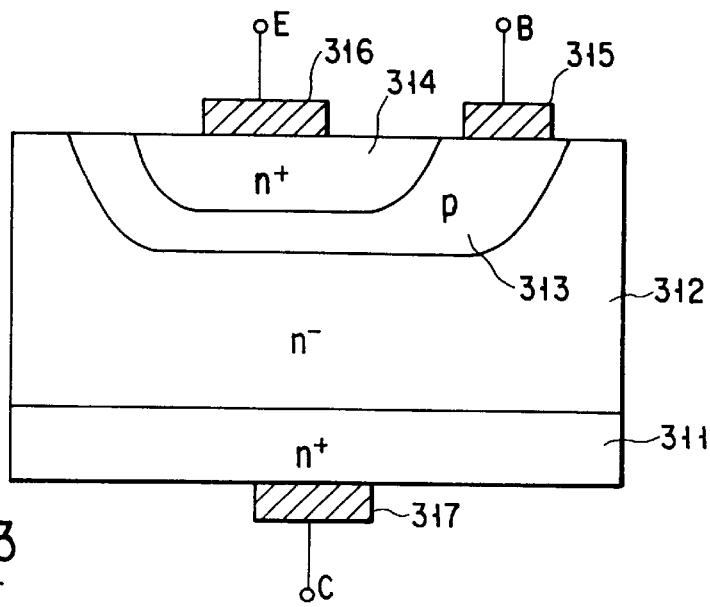
FIG. 3 is a sectional view schematically showing a configuration of a conventional bipolar transistor.
Figure 4:
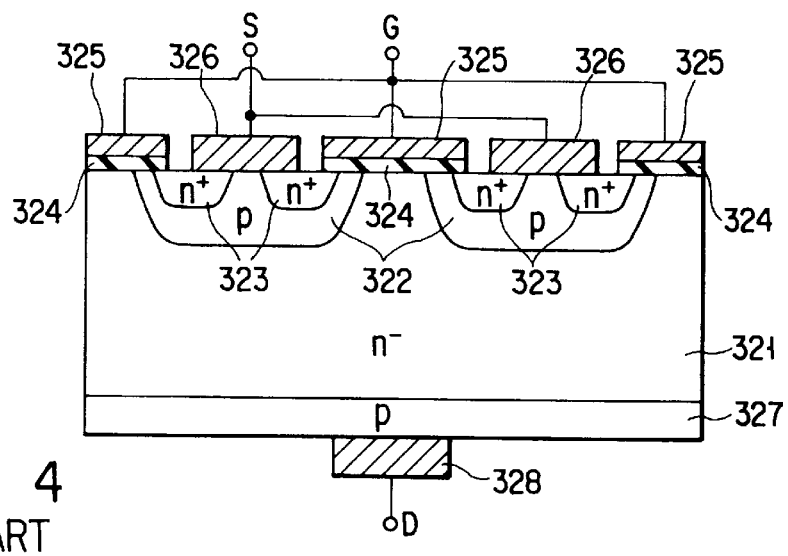
FIG. 4 is a sectional view schematically showing a configuration of a conventional IGBT.
Figure 5:
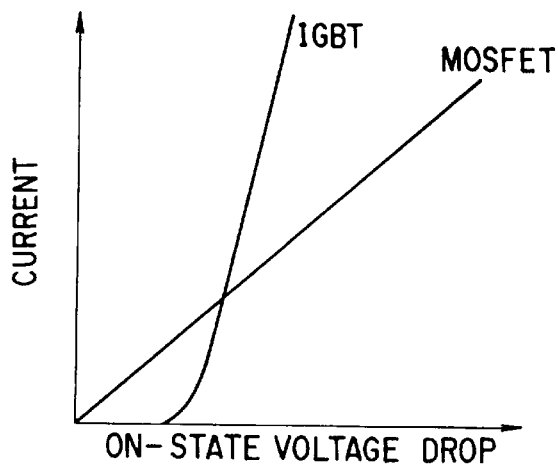
FIG. 5 is a diagram showing the relation between on-state voltage drop and current of a conventional MOSFET and a conventional IGBT.

Embodiments of the invention will be described below with reference to the accompanying drawings. In the embodiments described below, the first conductivity type is referred to as n-type, and the second conductivity type as p-type.

(First Embodiment)

FIG. 6 is a diagram schematically showing a configuration of a MOSFET according to a first embodiment of the invention. This MOSFET comprises a drain electrode 12 formed on an n-type substrate 11 constituting an n-type drain layer. Also, the surface of the n-type substrate 11 far from the drain electrode 12 is formed with a lower n-type base layer 13 grown by epitaxial growth. The surface of the lower n-type base layer 13, on the other hand, is formed with a striped lower buried p-type layer 14 as floating mesh layer.

The lower buried p-type layer 14 is formed with a second n-type base layer 15 in the same manner as the n-type base layer 13. The surface of the middle n-type base layer 15 is formed with a striped upper buried p-type layer 16. In similar fashion, the upper buried p-type layer 16 is formed with an upper n-type base layer 17. The surface of the upper n-type base layer 17 is formed selectively with a plurality of p-type base layers 18 by diffusion. The surface of each p-type base layer 18 is formed selectively with n-type source layers 19.

A gate electrode 21 is formed through a Si oxide film 20 in an region extending from one p-type base layer 18 to an adjacent p-type base layer 18 through each one of the n-type source layers 19 of the respective p-type base layers 18. Also, each adjacent pair of source electrodes 22 is formed in such positions as to hold a gate electrode 21 therebetween on each adjacent first p-type base layers 18 and each one of the first n-type source layers 19 of the respective second p-type base layers 18.

The MOSFET has a breakdown voltage BV of 600 V.

The lower, middle and upper n-type base layers 13, 15, 17 share the breakdown voltage BV of 600 V and are allotted with a voltage Vs of 200 V, respectively. The impurities concentration Ns, therefore, is smaller than $1.897 \times 10^{18} \times Vs^{-1.35} [cm^{-3}]$. In this case, the impurities concentration Ns is set $1 \times 10^{15} [cm^{-3}]$ allowing for a margin of 25% over the figure obtained by substituting Vs of 200 into the above formula. This impurities concentration Ns is about three times as high as the value in the prior art.

Also, each of the middle and the upper base layers 15, 17 has a thickness Ws smaller than $1.1247 \times 10^{10} \times Ns^{-0.85} [cm]$. In similar fashion, the thickness Ws is set to 14 µm allowing for a margin of 25% over the figure obtained by substituting Ns of $1 \times 10^{15}$ into the formula described above.

Each of the lower and the upper buried p-type layers 14, 16, on the other hand, as shown in FIG. 7, has the relation between thickness t and interval W of formation thereof satisfying the formula 5t>W. The reason is that a narrower interval W would narrow the current path resulting in an increased on-resistance due to the JFET effect, while a larger interval W would lead to a structure equivalent to a device lacking the buried p-type layers 14, 16.

Also, the lower and upper buried p-type layers 14, 16 are formed in such a manner as to satisfy the relation 3Ws>tW/Ws when each of the lower and upper n-type base layers 13, 15, 17 has a thickness of one bulk. These buried p-type layers 14, 16 are potentially floated with a plurality of striped p-type regions thereof interconnected at the terminal section.

Now, the operation of this MOSFET will be explained.

Figure 8:
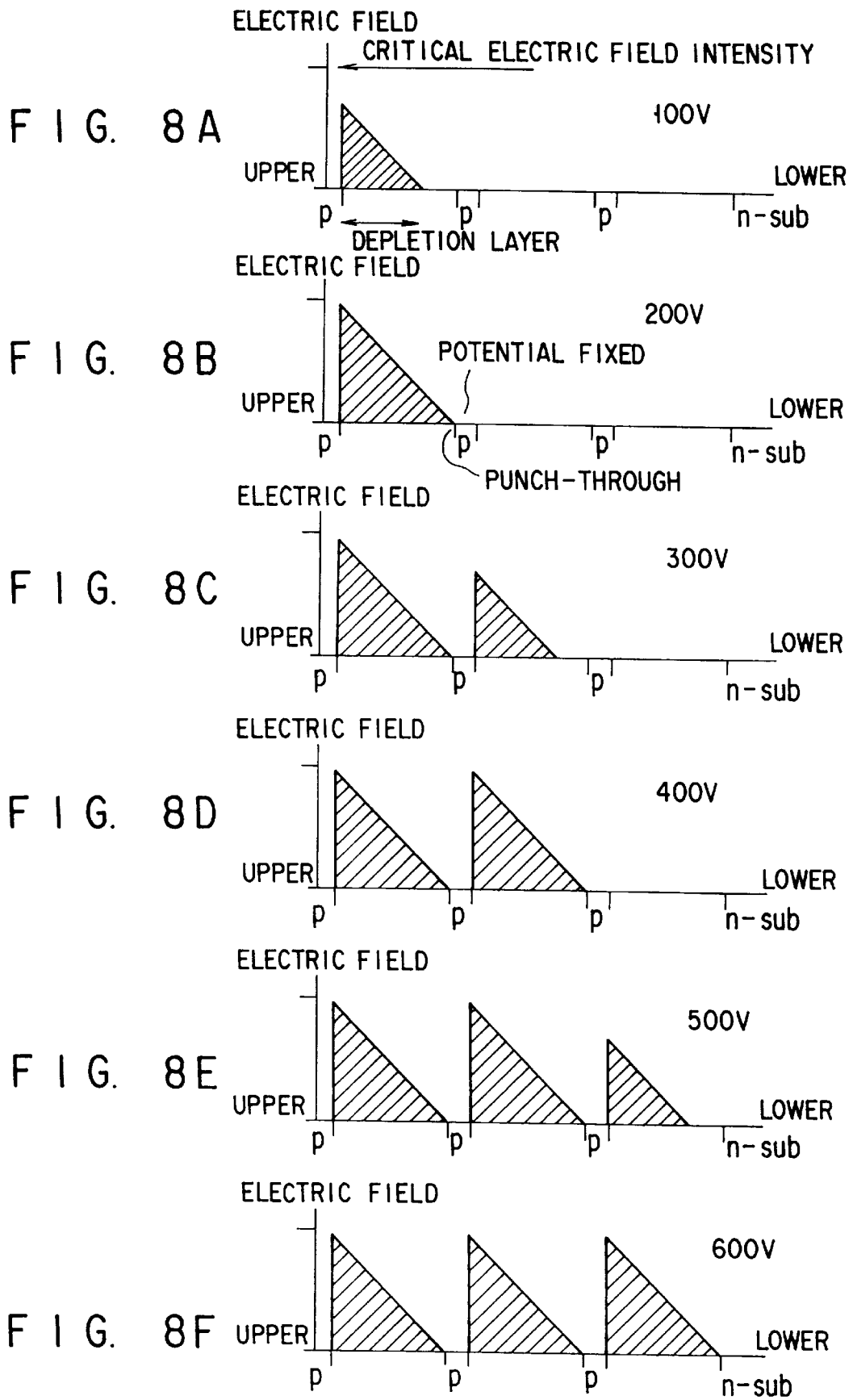
FIGS. 8A to 8F are diagrams for explaining the operation of a MOSFET according to the same embodiment.

In the case where a voltage of 200 V or less is applied, as shown in FIG. 8A, depletion layers expand from the p-type base layers 18 into the upper n-type base layer 17 toward the drain electrode 12 in a similar fashion to the normal MOSFET, so that a point of strongest electric field occurs near the interface between the p-type base layers 18 and the upper n-type base layer 17.

In the case where the applied voltage reaches 200 V, as shown in FIG. 8B, the n-type base layer 17 is depleted so that the buried p-type layer 16 is punched through and potentially fixed when the depletion layer reaches the upper buried p-type layer 16. As a result, the increase of the strongest point of electric field on the p-type base layer 18 is suppressed. The entire area of the buried p-type layer is not required to be punched through but only a part of the buried p-type layer 16.

When the applied voltage exceeds 200 V, as shown in FIG. 8C, the depletion layer newly expands into the middle n-type base layer 15 toward the drain electrode 12 from the buried p-type layer 16. Another strongest point of electric field thus occurs on the buried p-type layer 16 side separate from the strongest point of electric field described above.

When the applied voltage reaches 400 V, as shown in FIG. 8D, the depletion layer reaches the lower buried p-type layer 14 so that the buried p-type layer 14 is punched through and potentially fixed.

In similar fashion, when the applied voltage exceeds 400 V, as shown in FIG. 8E, the depletion layer expands in the lower n-type base layer 13 toward the drain electrode 12 from the buried p-type layer 14.

When the applied voltage reaches 600 V, as shown in FIG. 8F, the depletion layer reaches the n-type substrate 11. FIG. 9 shows the result of the two-dimensional numerical calculations of the electric field intensity distribution.

As described above, two buried p-type layers 14, 16 are formed in such positions as to divide an n-type base layer into three portions including the n-type base layers 13, 15, 17, and the maximum intensity of the electric field in each of the n-type base layers 13, 15, 17 is fixed by the buried p-type layers 14, 16. In this way, each of the n-typi base layers 13, 15, 17 is allotted with 200 V, thus realizing an overall breakdown voltage of 600 V.

Further, the device is designed in such a manner that the impurities concentration of the n-type base layers 13, 15, 17 is increased to reduce the on-resistance within a range including a critical value of the electric field exceeding the maximum intensity thereof. In this way, the on-state voltage drop can be reduced with a high breakdown voltage.

Figures 10A, 10B:
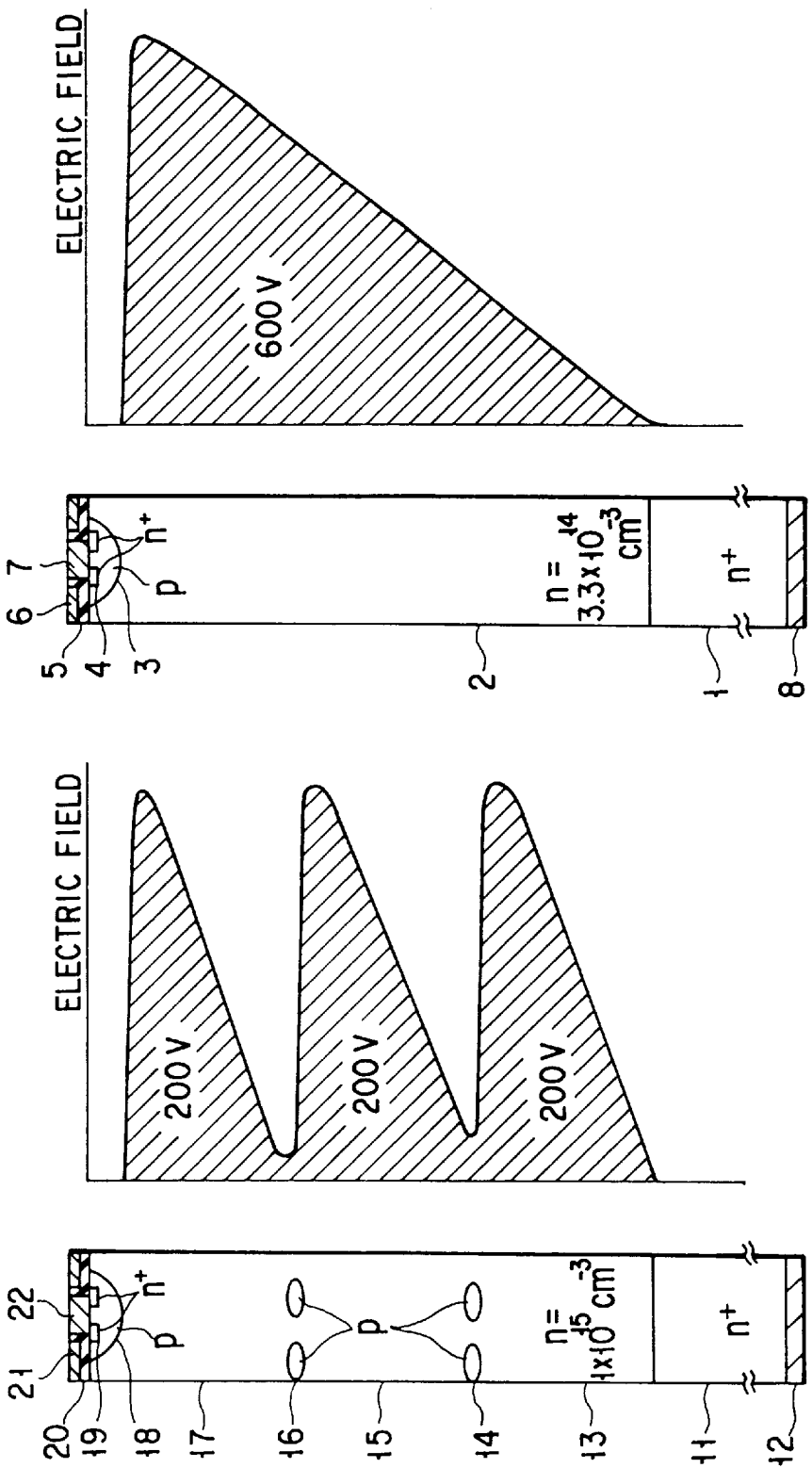
FIGS. 10A and 10B are diagrams for explaining by comparison between a MOSFET according to the same embodiment and a conventional MOSFET.

More specifically, in the MOSFET according to this embodiment, as shown in FIG. 10A, the impurities concentration of the n-type base layers 13, 15, 17 is $1 \times 10^{15}$ cm$^{-3}$. Conventionally, however, the breakdown voltage of only 250 V could be realized with this impurities concentration. As shown in FIG. 10B, it has so far been necessary to maintain the impurities concentration of $3.3 \times 10^{14}$ cm$^{-3}$ or about one third that of the present embodiment in order to realize the breakdown voltage of 600 V. In the MOSFET according to this embodiment, in contrast, the breakdown voltage of 600 V is distributed among the three n-type base layers separated by the buried p-type layers 14, 16 at the rate of 200 V each. Even with a high impurities concentration of $1 \times 10^{15}$ cm$^{-3}$, therefore, the breakdown voltage of 600 V can be realized. Also, the on-resistance of the MOSFET with a high breakdown voltage is reduced inversely as the carrier density of the high-resistance layer (n-type base layer). Consequently, as compared with the conventional MOSFET in which a low on-resistance is impossible to realize, the on-state voltage drop can be reduced considerably in the MOSFET according to the present embodiment.

Now, explanation will be made about a specific method of designing a MOSFET having the advantage described above.

The breakdown voltage BV of 600 V is distributed among the lower, middle and upper n-type base layers 13, 15, 17 at the rate of Vs of 200 V each. This voltage value Vs of 200 V is obtained from equation (1) below.

$$Vs=BV/(M+1) \quad (1)$$

where M is the number of the buried p-type layers 14, 16 (2 for the present embodiment). Equation (1) represents the case in which the voltage Vs or the impurities concentration Ns allotted to each of the n-type base layers 13, 15, 17 is equal to each other.

The impurities concentration Ns of each of the n-type base layers 13, 15, 17 is determined on the basis of FIG. 11 or formula (2) below.

$$Ns<1.897\times10^{18}\times Vs^{-1.35}[cm^{-3}] \quad (2)$$

Specifically, each of the n-type base layers 13, 15, 17 is formed in such a manner as to have the impurities concentration Ns of $1 \times 10^{15}$ [cm$^{-3}$] according to equation (3) allowing for a margin of 25% on the basis of formula (2).

$$Ns \cong 0.75\times1.897\times10^{18}\times Vs^{-1.35}[cm^{-3}] \quad (3)$$

Also, the thickness Ws of each of the middle and upper n-type base layers 15, 17 is determined on the basis of FIG. 12 or formula (4) below according to the impurities concentration Ns.

$$Ws < 1.1247 \times 10^{10} \times Ns^{-0.85} [\text{cm}] \quad (4)$$

where Ws is the shortest distance between the buried p-type layers 14, 16 for the middle n-type layer 15, and the shortest distance between a p-type base layer 18 and the lower buried p-type layer 16 under it for the upper n-type base layer 17.

Specifically, each of the middle and upper n-type base layers 15, 17 is formed to have a thickness Ws of 14 μm on the basis of equation (5) allowing for a margin of about 25% from formula (4).

$$Ws \approx 0.75 \times 1.1247 \times 10^{10} \times Ns^{-0.85} [\text{cm}] \quad (5)$$

The thickness Ws of the lower n-type base layer 13, on the other hand, may assume a value exceeding the value of equation (4) without being determined from formula (4) or (5). This is because the lower n-type base layer 13 is in contact with the n-type substrate 11 and therefore is not required to be punched through by a depletion layer extending into it.

Now, a method of designing the buried p-type layers 14, 16 will be described below.

Figure 13:
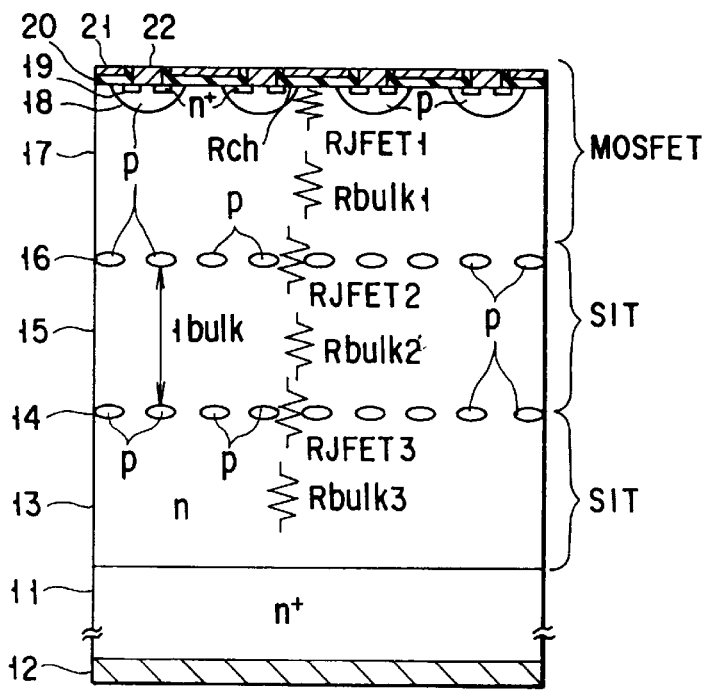
FIG. 13 is a diagram for explaining an equivalent circuit of a MOSFET according to the same embodiment.

The MOSFET according to this embodiment, as shown in FIG. 13, is considered to include a MOSFET in series with two SITs (static induction transistors), and the on-resistance is given by equation (6) below.

$$\text{On-resistance} = \text{Rch} + \text{RJFET1} + \text{Rbulk1} + \text{RJFET2} + \text{Rbulk2} + \text{RJFET3} + \text{Rbulk3} \quad (6)$$

If the on-resistance is to be reduced, the resistances RJFET1 to RJFET3 in equation (6) are required to remain low.

Among the on-resistances of the conventional MOSFETs, the resistance of the n-type base layer 302 is expressed by equation (7) below using the parameters of the MOSFET according to the present embodiment.

$$\text{Resistance of conventional n-type base layer} = (M+1) \times Ws/(q\mu(Ns/(M+1))) = (M+1)^2 \times Ws/(q\mu Ns) \quad (7)$$

where q is the unit charge and μ is the mobility. Also, the carrier density of the conventional MOSFET is 1/(M+1) times as large as the carrier density Ns of the present embodiment.

Among the on-resistances of the MOSFET according to the present embodiment, the resistance of the n-type base layers 13, 15, 17 is given by equation (8) below.

$$\text{Resistance of n-type base layer of the embodiment} = (M+1)Ws/(q\mu Ns) + M(tW/Ws)/(q\mu Ns) \quad (8)$$

This indicates that the condition required to be met for the on-resistance of the embodiment to be smaller than that of the conventional MOSFET is determined by formula (9) below on the basis of formulae (7) and (8) described above.

$$(M+1)Ws > tW/Ws \quad (9)$$

This design method can produce a MOSFET according to the present embodiment accurately.

Figure 14:
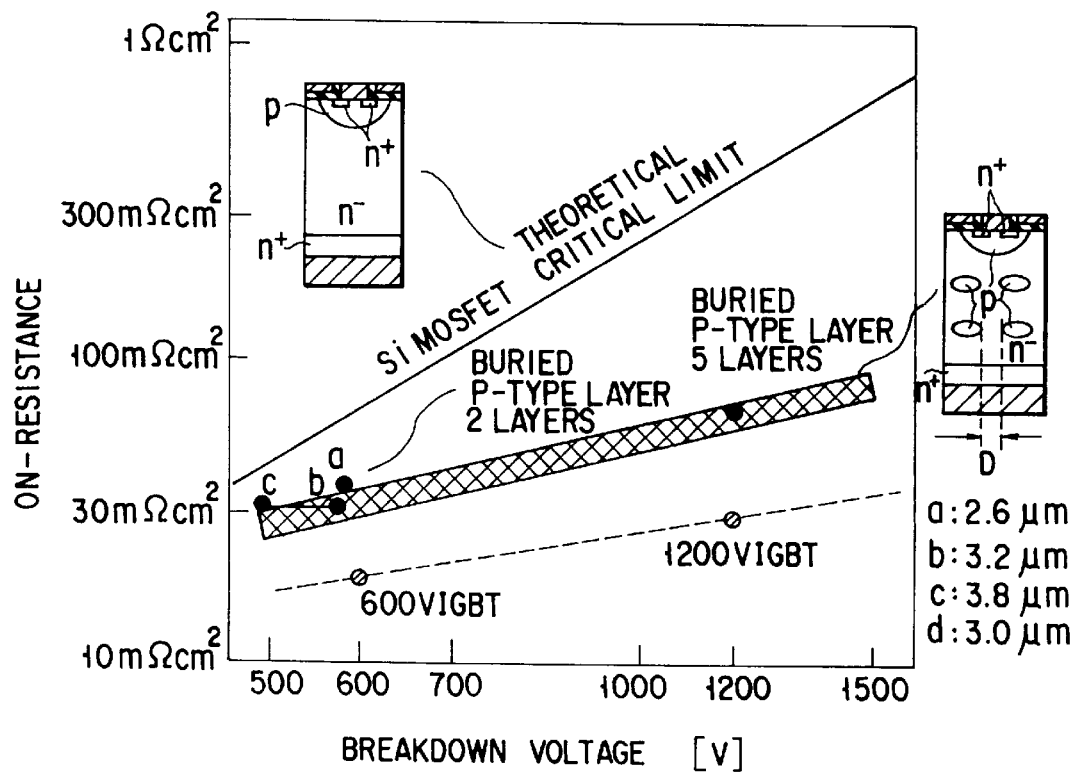
FIG. 14 is a diagram showing the relation between on-resistance and breakdown voltage of a MOSFET according to the same embodiment.

FIG. 14 is a diagram showing the relation between on-resistance and breakdown voltage of a MOSFET designed in this way. As shown, an on-resistance one half the theoretical critical value is realized with the breakdown voltage of 600 V. With the breakdown voltage of 1200 V, on the other hand, it is indicated that the on-resistance can be reduced to a value several times as small as the theoretical critical value.

Figure 15:
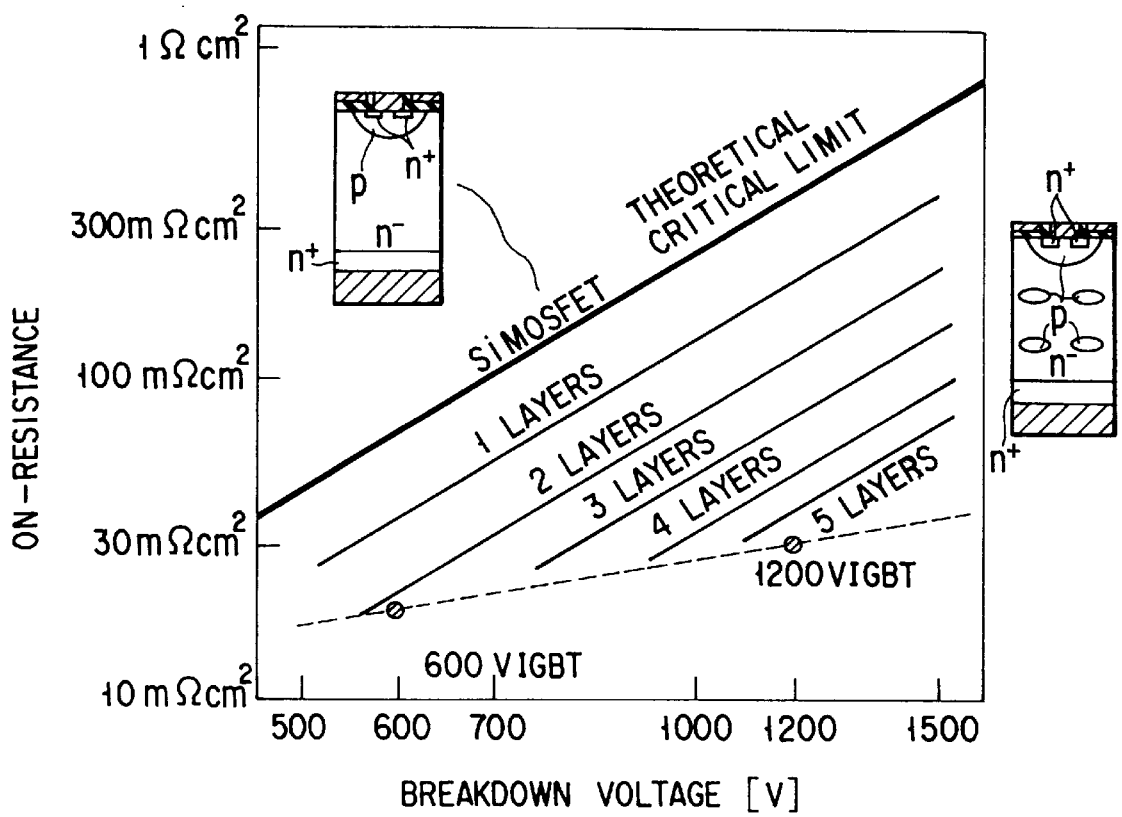
FIG. 15 is a diagram showing a theoretically possible relation between on-resistance and breakdown voltage of a MOSFET according to the present invention.

FIG. 15 is a diagram showing the relation between on-resistance and breakdown voltage theoretically possible for a MOSFET according to the present invention. As shown, the on-resistance can be reduced at a rate proportional to the number M of the buried p-type layers. There occurs a deflection between FIGS. 14 and 15 with the increase in the number M, because the relation of FIG. 14 is based on the assumption that the device has a two-dimensional structure for numerical calculations in spite of its actual three-dimensional structure.

As described above, according to the first embodiment, the depletion layer expands from the p-type base layers 18 toward the drain electrode 12 in proportion to the increase in the applied voltage while the device is in off state, and when this depletion layer reaches the buried p-type layer 16, the punch-through phenomenon fixes the electric field intensity in the depletion layer and suppresses the increase thereof. By increasing the carrier density and reducing the on-resistance of the n-type base layer 17 within a range having a critical value of the electric field intensity exceeding the maximum value of the prevailing electric field intensity, therefore, the on-state voltage drop can be reduced with a high breakdown voltage.

Also, according to this embodiment, the design conditions are determined clearly by formulae (1), (2) and (4) and FIGS. 11 and 12, and therefore a device which accurately operates can be fabricated with a high reproducibility.

(Second Embodiment)

Now, explanation will be made about a MOSFET according to a second embodiment of the invention.

Figure 16A:
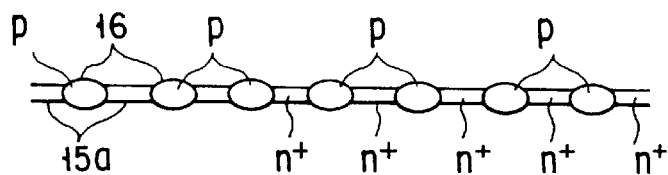
FIG. 16A is a diagram schematically showing a configuration of a buried p-type layer of a MOSFET according to a second embodiment of the invention.
Figure 16B:
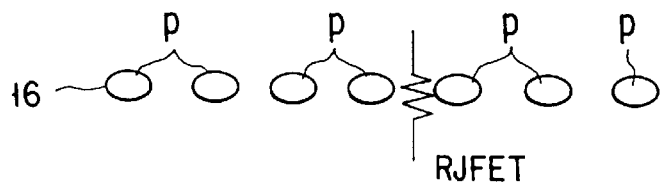
FIG. 16B is an enlarged view of the buried p-type layer shown in FIG. 6.

FIG. 16A is a diagram schematically showing a configuration of a buried p-type layer of a MOSFET. FIG. 16B is an enlarged view of the buried p-type layer shown in FIG. 6. The same component parts in FIG. 16B as those in FIG. 6 are designated by the same reference numerals, respectively, and will not be described in detail. Only those component parts in FIG. 16B not included in the configuration of FIG. 6 will be described below.

Specifically, this MOSFET has a configuration modified from the first embodiment, and is intended to reduce the on-resistance by reducing the resistance RJFET between the p-type sections in the buried p-type layer 16 (or 14) as shown in FIG. 16B. More specifically, as shown in FIG. 16A, each portion of the n-type base layer 15 between the p-type sections in the buried p-type layer 16 (or 14) is formed with a $n^+$-type layer 15a having a higher carrier density than the carrier density Ns of the p-type base layer 15.

As a result, in addition to the effects of the first embodiment, this embodiment has a reduced RJFET thereby further reducing the on-resistance.

(Third Embodiment)

Now, explanation will be made about a Schottky barrier diode according to a third embodiment of the invention.

Figure 17:
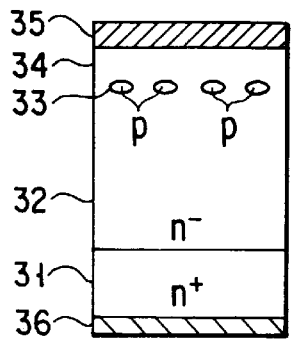
FIG. 17 is a diagram schematically showing a Schottky barrier diode according to a third embodiment of the invention.

FIG. 17 is a diagram schematically showing a configuration of the Schottky barrier diode. This Schottky barrier diode has a lower n-type base layer 32 formed by diffusion on an n-type substrate 31 and a striped p-type FLM layer 33 formed on the surface of the lower n-type base layer 32.

The buried p-type layer 33 is formed with an upper n-type base layer 34, and the surface of the upper n-type base layer 34 is formed with a Schottky electrode 35. The thickness of the upper n-type base layer 34 is designed in such a magnitude that the depletion layer in the Schottky interface reaches the buried p-type layer 33 at a low voltage causing a small leak current from the Schottky junction. The surface of the n-type substrate 31 far from the lower base layer 32, on the other hand, is formed with an ohmic electrode 36.

Now, the operation of this Schottky barrier diode will be explained.

Assume that reverse bias voltages (a negative voltage to the Schottky electrode 35, and a positive voltage to the ohmic electrode 36) are applied to the Schottky barrier diode.

In the upper n-type base layer 34, the depletion layer expands from the interface with the Schottky electrode 35 toward the ohmic electrode 36, and the point of strongest electric field intensity occurs in the interface of the Schottky electrode 35.

In spite of this, with the increase in the reverse bias voltage, the depletion layer reaches the buried p-type layer 33 so that the point of the strongest electric field intensity in the Schottky boundary is fixed and ceases to rise. The depletion layer thus expands toward the anode (downward in the drawing) anew from the FLM layer. Since the reverse bias voltage is designed to assume a low value, the electric field intensity in the Schottky interface is fixed to a low value. The leak current can thus be reduced.

In this Schottky barrier diode, the leak current can be reduced especially during high-temperature operation. Further, unlike in the prior art, a guard ring of a p-type layer is not required to be formed. Nor is the problem posed of the bipolar operation in the guard ring.

(Fourth Embodiment)

Now, a Schottky barrier diode according to a fourth embodiment of the invention will be explained.

Figure 18:
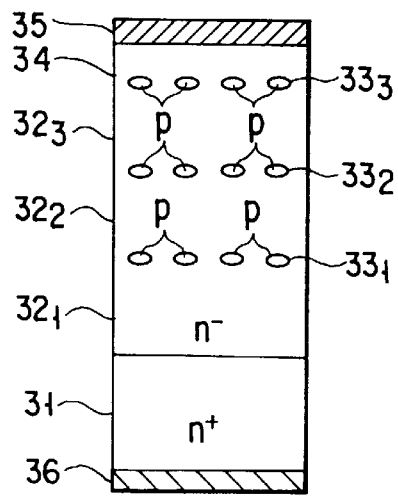
FIG. 18 is a diagram schematically showing a configuration of a Schottky barrier diode according to a fourth embodiment of the invention.

FIG. 18 is a diagram schematically showing a configuration of a Schottky barrier diode according to this embodiment. Those component parts identical to those in FIG. 17 are designated by the same numerals as the corresponding parts in FIG. 17 and will not be described in detail. Only those component parts not included in FIG. 17 but in FIG. 18 will be described.

Specifically, the Schottky barrier diode under consideration is a modification of the third embodiment, and is intended to improve the breakdown voltage and reduce the on-state voltage drop. More specifically, as shown in FIG. 18, a plurality of n-type base layers $32_1$ to $32_3$ and a plurality of buried p-type layers $33_1$ to $33_3$ are formed separately by alternate deposition on an n-type substrate 31.

As a result, in addition to the effects of the third embodiment, as described above, the n-type base layers $32_1$, to $32_3$ divided by the buried p-type layers $33_1$ to $33_3$ share the breakdown voltage. A Schottky barrier diode of a low on-state voltage drop with high breakdown voltage that has conventionally been impossible to realize can be realized.

(Fifth Embodiment)

Now, an IGBT according to a fifth embodiment of the invention will be explained.

Figure 19:
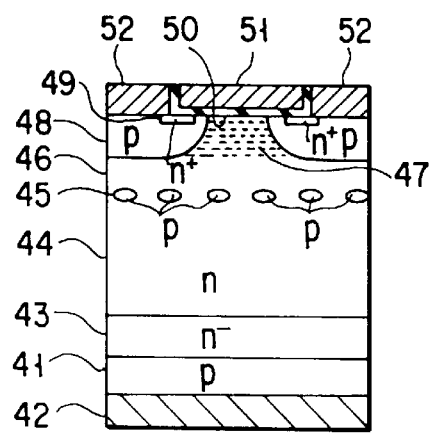
FIG. 19 is a diagram schematically showing a configuration of an IGBT according to a fifth embodiment of the invention.

FIG. 19 is a diagram schematically showing a configuration of an IGBT according to this embodiment. This IGBT comprises a p-type substrate 41 constituting a p-type emitter layer and a drain electrode 42 formed on the p-type substrate 41. Also, the surface of the p-type substrate 41 far from the drain electrode 42 is formed with an n-type buffer layer 43 and a lower n-type base layer 44. The surface of the lower n-type base 44 is formed with a striped buried p-type layer 45.

The buried p-type layer 45 is formed with an upper n-type base layer 46. The surface of the upper base layer 46 is formed with a $n^+$-type layer 47 having a carrier density higher than that of the n-type base layer 46. The $n^+$-type layer 47 is formed selectively by diffusion with a plurality of p-type base layers 48 having such a depth as to reach the n-type base layer 46. The surface of each p-type base layer 48 is formed selectively with an n-type source layer 49. The buried p-type layer 45 and the p-type base layer 48 are formed in proximity to each other so as to suppress the maximum electric field intensity to a low value.

A gate electrode 51 is formed through a Si oxide film 50 in an area extending from one p-type base layer 48 with an associated n-type source layer 49 through the $n^+$-type layer 47 to another p-type base layer 48 with an associated n-type source layer 49. Also, a source electrode 52 is formed on each first p-type base layer 48 with an associated first n-type source layer 49 in such a position adjacent source electrodes hold the gate electrode 51 therebetween.

Also with this configuration, the on-state voltage drop can be reduced in proportion to the carrier density of the $n^+$-type layer 47. Further, the reduction in breakdown voltage which otherwise might occur with the drop in the on-state voltage drop is prevented by the buried p-type layer 45. More specifically, provision of the buried p-type layer 45 in proximity to the p-type base layers 48 can suppress the increase of the point of strongest electric field intensity considerably in the vicinity of the $n^+$-type layer 47. A reduced on-state voltage drop and a increased breakdown voltage can thus be realized at the same time.

(Sixth Embodiment)

Now, an IGBT according to a sixth embodiment of the invention will be explained.

Figure 20:
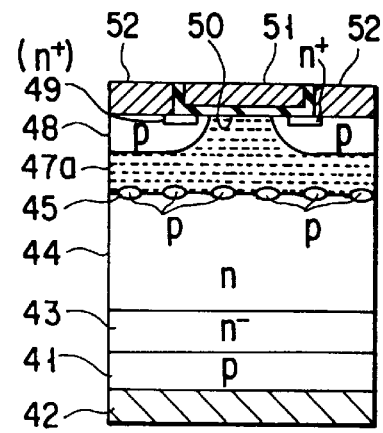
FIG. 20 is a diagram schematically showing a configuration of an IGBT according to a sixth embodiment of the invention.

FIG. 20 is a diagram schematically showing a configuration of an IGBT according to this embodiment. In FIG. 20, the component parts identical to those of FIG. 19 are designated by the same reference numerals and those component parts substantially identical to those in FIG. 19 by reference numerals with suffix a, respectively, and will not be described in detail. Only those component parts in FIG. 20 which are not included in the configuration of FIG. 19 will be described below.

Specifically, this IGBT is a modification from the fifth embodiment and is intended to further reduce the on-state voltage drop. More specifically, as shown in FIG. 20, a $n^+$-type layer 47a having a region extending over the $n^+$-type layer 47 and the upper n-type base layer 46 is formed on the buried p-type layer 45 in place of the $n^+$-type layer 47 and the upper n-type base layer 46.

The $n^+$-type layer 47a has a carrier density higher than that of the n-type base layer 44 as in the previous case.

In this way, since the $n^+$-type layer 47a with a high carrier density is formed on the buried p-type layer 45, the advantage of a still lower on-state voltage drop can be obtained in addition to the effects of the fifth embodiment.

(Seventh Embodiment)

Now, an IGBT according to a seventh embodiment of the invention will be explained.

Figure 21:
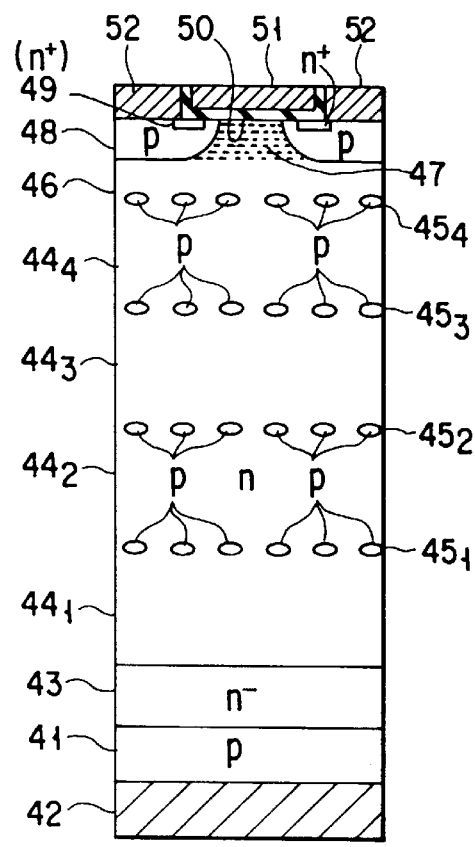
FIG. 21 is a diagram schematically showing a configuration of an IGBT according to a seventh embodiment of the invention.

FIG. 21 is a diagram schematically showing a configuration of an IGBT according to this embodiment. In FIG. 21, the same component parts as those in FIG. 19 are designated by the same reference numerals, respectively, and will not be described in detail. Only those component parts of the configuration of FIG. 21 not included in that of FIG. 19 will be described below.

Specifically, this IGBT is a modification of the fifth embodiment and is intended to further reduce the on-state voltage drop. More specifically, as shown in FIG. 21, a plurality of n-type base layers $44_1$ to $44_4$ and a plurality of buried p-type layers $45_1$ and $45_4$ are deposited alternately.

This configuration, in addition to the effects of the fifth embodiment, can increase the carrier density of the n-type base layers $44_1$ to $44_4$, 46 due to the presence of buried p-type layers $45_1$ to $45_4$ and therefore can further reduce the on-state voltage drop.

Now, four specific methods (a) to (d) of fabricating a MOSFET and a Schottky barrier diode according to this embodiment will be described with reference to the process diagrams of FIGS. 22 to 25. The explanation that follows can be applied also to a method of fabricating an IGBT by using a p-type substrate (p-type emitter layer) having an n-type buffer layer thereon in place of an n-type substrate.
(Fabrication Method A)

Figure 22A:
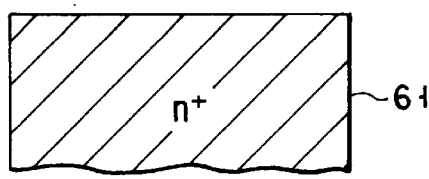
FIGS. 22A to 22D are sectional views of processes for explaining a method of fabricating a semiconductor device according to the present invention.
Figure 22B:
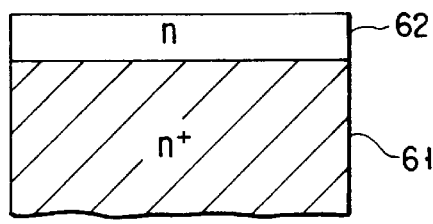

As shown in FIGS. 22A and 22B, a first n-type base layer 62 is formed by epitaxial growth on an n-type substrate 61 constituting an n-type drain layer.

Figure 22C:
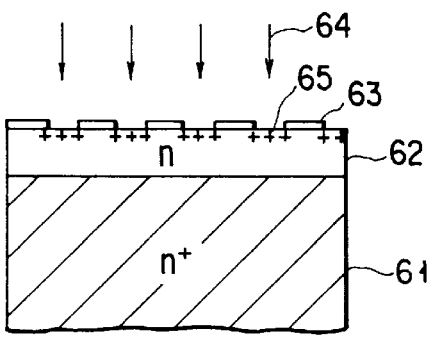
Figure 22D:
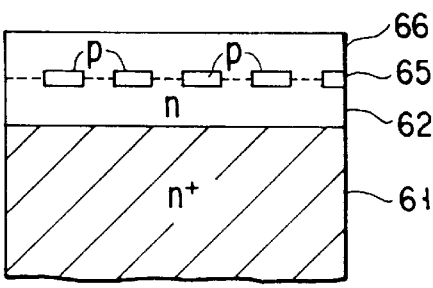

As shown in FIG. 22C, the next step is to form a mask 63 on the first n-type base layer 62 and implant ions 64 of indium, gallium or boron. In the process, the ions are accelerated at a high voltage and implanted to the depth of about 0.2 μm to about 3 μm from the surface. In this way, the positive diffusion can be reduced at the time of subsequent epitaxial growth, thereby making it possible to form a buried p-type layer with fine meshes. This ion-implanted layer 65 provides a seed of a buried p-type layer. After ion implantation, the mask 63 is removed and, as shown in FIG. 22D, the surface of the first n-type base layer 62 implanted with ions is formed with an n-type base layer 66 by epitaxial growth.

In similar fashion, the ion implantation and epitaxial growth are repeated thereby to form a MOSFET (or a Schottky barrier diode or IGBT) having buried p-type layers in the number of M.
(Fabrication Method B)

In a manner similar to the method shown in FIGS. 22A and 22B, an n-type substrate 61 having a first n-type base layer 62 formed thereon is prepared.

Figure 23A:
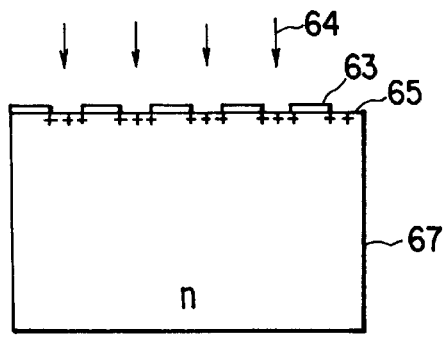
FIGS. 23A to 23D are sectional views of processes for explaining a method of forming a semiconductor device according to the present invention.
Figure 23B:
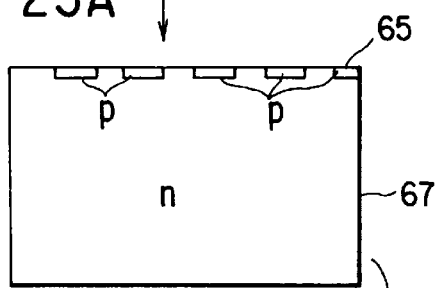

As shown in FIG. 23A, on the other hand, a mask 63 is formed on an n-type substrate 67 having a carrier density lower than the n-type substrate 61. After that, ions 64 of indium, gallium or boron are injected. After that, the mask 63 is removed as shown in FIG. 23B.

Figure 23C:
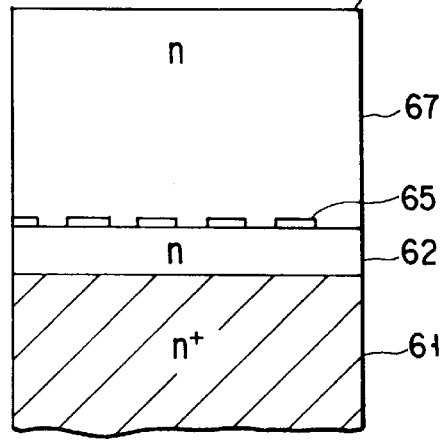

Then, as shown in FIG. 23C, the ion-implanted surface is bonded to the first n-type base layer 62 described above.

Figure 23D:
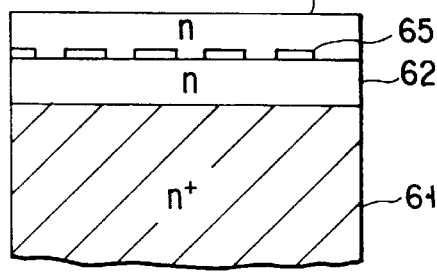

Further, as shown in FIG. 23D, the n-type substrate 67 inverted and bonded is formed to a predetermined thickness by polishing.

In similar fashion, the selective ion implantation and the wafer bonding are repeated thereby to form a MOSFET (or a Schottky barrier diode or IGBT) having an arbitrary number M of buried p-type layers. As an alternative, the MOSFET may be formed by ion implantation and epitaxial growth after wafer bonding,.
(Fabrication Method C)

Figure 24A:
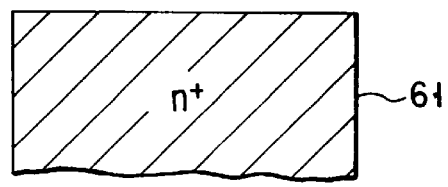
FIGS. 24A to 24D are sectional views of processes for explaining a method of forming a semiconductor device according to the present invention.
Figure 24B:
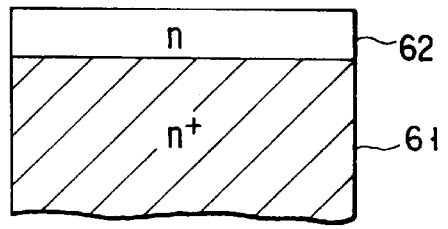
Figure 24C:
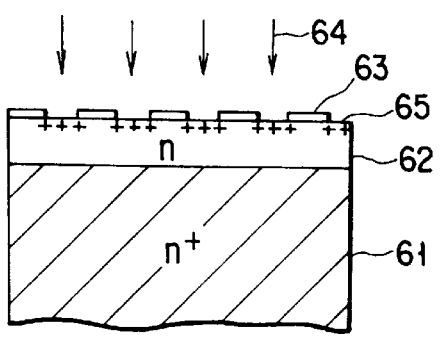

In the same manner as described above, a first n-type base layer 62 is formed on an n-type substrate 61 as shown in FIGS. 24A to 24C, and a plurality of ion implantated layers 65 are selectively formed in the surface of the first n-type base layer 62.

Figure 24D:
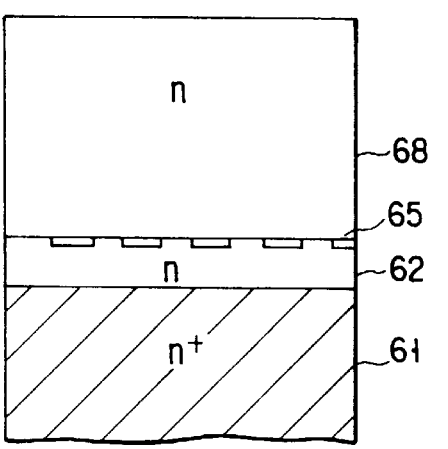

After that, as shown in FIG. 24D, the surface of the first n-type base layer 62 is bonded with another n-type substrate 68.

This fabrication method C can also form a MOSFET or the like having a number M of buried layers in the manner similar to the fabrication method B.

In the fabrication methods (A) to (C), the buried p-type layers may be diffused sequentially. It is more preferable, however to form and then diffuse all the buried p-type layers simultaneously at the time of forming a p-type base layer in order to secure a uniform size, thickness and intervals of the buried p-type layers.

Figure 26:
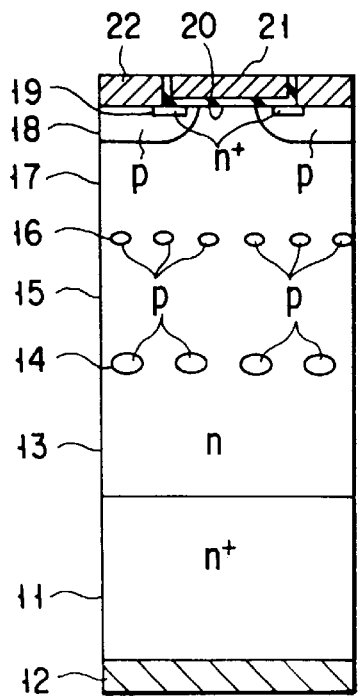
FIG. 26 is a diagram for explaining a method of fabricating a semiconductor device according to the invention.

Also, at the time of forming a number M of buried p-type layers, the buried p-type layer 14 under the buried p-type layer 16 may be formed in a larger size due to the tempera-ture or the like conditions prevailing at the time of formation. As shown in FIG. 26, therefore, the intervals of the p-type sections in the underlying buried p-type layer 14 are desirably set larger than the intervals of the p-type sections in the overlying buried p-type layer 16.

Further, the buried p-type layers may be formed by burying polysilicon instead of by diffusion.
(Fabrication Method D)

Figure 25A:
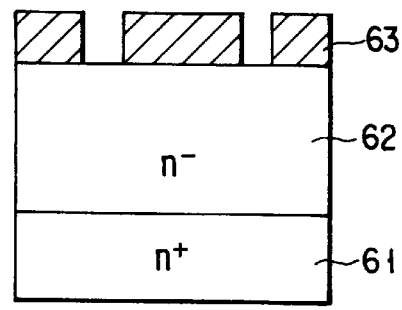
FIGS. 25A to 25C are sectional views of processes for explaining a method of forming a semiconductor device according to the present invention.
Figure 25B:
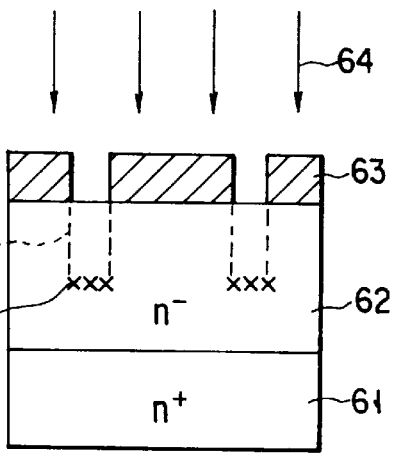
Figure 25C:
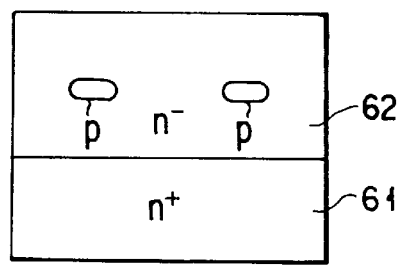

As shown in FIGS. 25A to 25C, an n-type base layer 62 is formed by epitaxial growth on an n-type substrate 61 making up an n-type drain layer. Then, a mask 63 having a predetermined pattern is formed on the n-type base layer 62. As the next step, ions 64 such as of $BF_2$ constituting a p-type impurities layer are implanted into the n-type base layer 62. By changing the acceleration energy for ion implantation, an ion implantated layer 65 can be formed to a predetermined depth. After removing the mask 63, the n-type substrate 61 and the n-type base layer 62 are heat-treated at a high temperature. As a result, ions of the n-type substrate 61 are diffused and activated to form a buried p-type layer. This heat treatment eliminates the defects generated in the regions 65a defined by dotted lines in FIG. 25B, thereby recovering the crystallinity of the n-type base layer 62.

It is also possible to form several p-type potential fixing layers of different depths by implanting impurities ions into the n-type base layer several times using different acceleration energies.

Now, a mask pattern used in this fabrication method will be explained.

Figure 27:
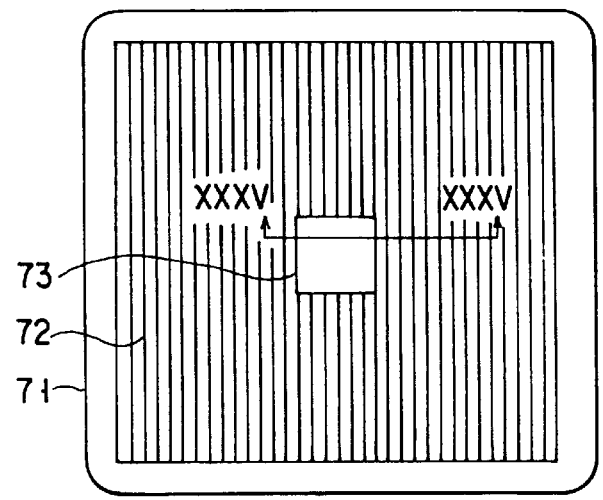
FIG. 27 is a plan view showing a mask pattern for forming a striped buried p-type layer according to the invention.

FIGS. 27 to 34 are plan views of a mask pattern for forming buried p-type layers. FIG. 27 is a plan view showing a mask pattern for forming buried p-type layers 14 in stripe. This mask pattern includes a substantially square frame section 71, a striped section 72 formed in the frame section 71, and a substantially square central section 73 arranged substantially at the center in the frame section 71. The frame section 71, the striped section 72 and the central section 73 are interconnected with each other.

Figure 35:
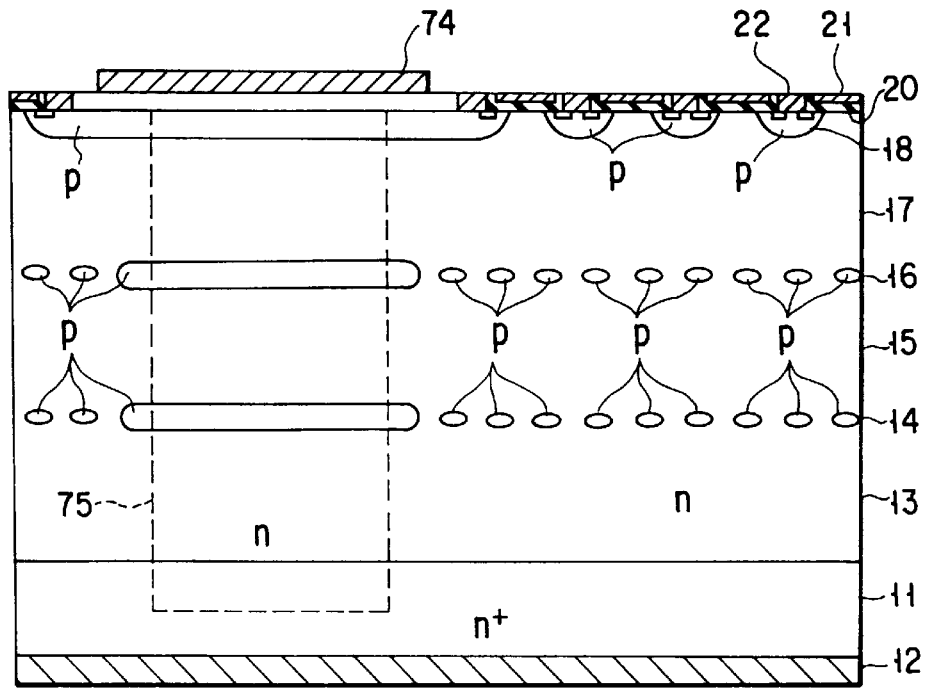
FIG. 35 is a sectional view taken in line XXXV—XXXV in FIG. 27.

The central section 73 is for determining the potential of the buried p-type layers 14 by punch-through. As shown in the sectional view of FIG. 35 taken in line XXXV—XXXV of FIG. 27, the central section 73 is positioned to an area 75 in which the depletion layer expands (defined by dotted lines in the drawing) under the gate electrode 74. Also, the central section 73 determines the potential using the wide area 75 under the gate electrode pad 74 by positioning. Even when a positioning error occurs due to variations in the fabrication processes, sufficient overlapped portions eliminates the change in breakdown voltage for an improved yield. Also, the reduction in the effective area of the semiconductor device can be avoided. If only an improved breakdown voltage is desired, however, the positioning is not required.

Figure 28:
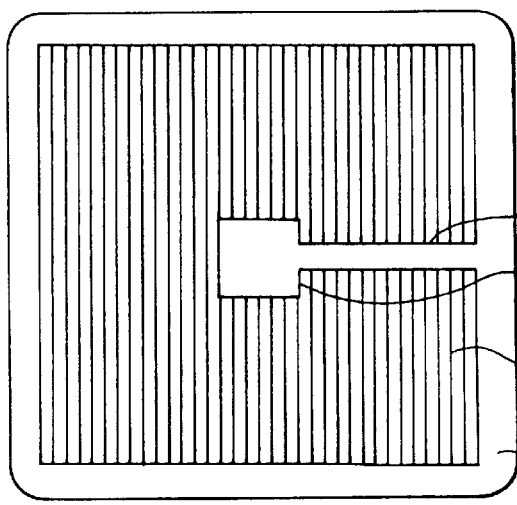
FIG. 28 is a plan view showing a modification of the pattern of FIG. 21.

FIG. 28 is a plan view showing a modification pattern from FIG. 27, which has a linear connector 76 perpendicular to the striped section 72 between the central section 73 and the frame section 71. This connector section 76 is for electrically connecting the central section 73 and the frame section 71 securely to each other and is wider than the intervals of the parallel straight lines of the striped section 72.

Figure 29:
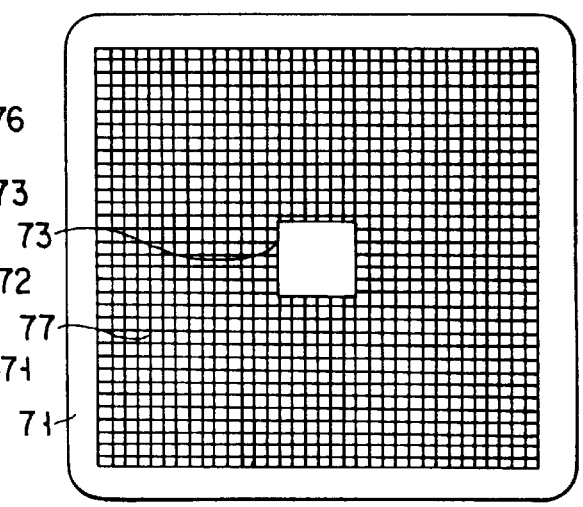
FIG. 29 is a plan view showing a mask pattern for forming a meshy buried p-type layer according to the invention.

FIGS. 29 and 30 are plan views showing a mask pattern for forming buried p-type layers in mesh. These configurations have a grid-like meshy section 77 in place of the striped section 72 in FIGS. 27 and 28. These meshy mask patterns permits a semiconductor device of higher breakdown voltage to be fabricated than when using a striped mask pattern.

FIG. 31 is a plan view showing a dotted mask pattern. This mask pattern includes a plurality of dots 78 arranged equidistantly along columns and rows. The p-type FLM layers formed in dots are not connected electrically with each other, and the terminal sections thereof therefore function like a guard ring. In the case of planar structure, therefore, it is possible to form a semiconductor device of high breakdown voltage.

FIG. 32 is a plan view showing a modification pattern from FIG. 31. As compared with FIG. 31, the dots 78 are displaced by one half of the inter-dot interval along the row to secure an equal distance between the dots 78 of all adjacent dot pairs in rows and columns. The resulting high-density dot pattern is advantageous for the purpose of improving the breakdown voltage.

FIG. 33 is a plan view showing a striped mask pattern requiring no positioning. This mask pattern includes a plurality of striped sections 81 having a plurality of parallel straight lines, and a plurality of connector sections 82 arranged in parallel to each other perpendicular to the striped sections 81. Each connector section 82 is wider than the width of each parallel straight line of the striped section 81, and has dual function of electrically securely connecting the parallel straight lines of the striped section 81 to each other and determining the potential of the buried p-type layers 14 and the like by punch-through.

The interval between the connector sections 82 is set on the basis of the chip size in such a manner that at lest one connector section 82 is located with the device portion of each chip. The connector sections 82 and the striped sections 81 may be crossed with each other at an angle.

FIG. 34 is a plan view showing a modification pattern from FIG. 33 and shows a configuration having a square section 83 wider than the connector section 82. This square section 83 is for enlarging the area for determining the potential of the buried p-type layer by punch-through and blocks the variations in potential of the buried p-type layers. Also, the size and intervals of the square section are determined in such a way that at least one square section is accommodated in the device portion of each chip without positioning.

Although the frame section 71, the central section 73, the connector sections 76, 77 and the square section 83 are shown in reverse background in FIGS. 27 to 34, the reversed portion other than shown by the solid lines of course also represents a transparent section of the mask pattern.

(Eighth Embodiment)

Now, explanation will be made about a MOSFET according to an eighth embodiment of the invention.

Figure 36:
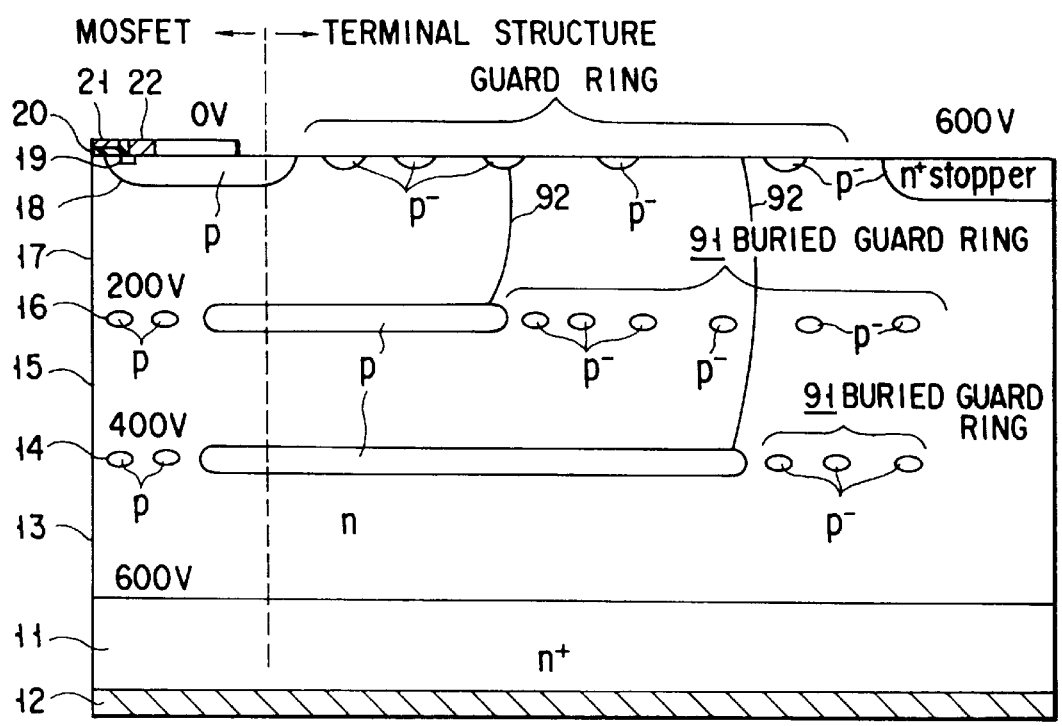
FIG. 36 is a diagram schematically showing a terminal structure of a MOSFET according to an eighth embodiment of the invention.

FIG. 36 is a diagram schematically showing a terminal structure of this MOSFET, in which the component parts identical to those in FIG. 6 are designated by the same reference numerals as the corresponding parts in FIG. 6, respectively, and will not be described in detail. Only those component parts not included in FIG. 6 will be described below.

Specifically, this MOSFET is a modification of each embodiment and is intended to prevent the deterioration of the breakdown voltage at the device terminal of planar structure. More specifically, as shown in FIG. 36, the outer peripheral portion of each of the buried p-type layers 14, 16 is formed with a plurality of substantially square buried guard rings 91 surrounding the buried p-type layers 14, 16 as viewed from the top of the device.

In this terminal structure, each guard ring widens of intervals between the equipotential lines 92, so that electric field intensity is relaxed, which in turn prevents the deterioration of the breakdown voltage of the device terminal.

(Ninth Embodiment)

Now, explanation will be made about a MOSFET according to a ninth embodiment of the invention.

FIG. 37 is a diagram schematically showing a terminal structure of this MOSFET. The same component parts as in FIG. 36 are designated by the same reference numerals, respectively, and will not be descried in detail. Only the component parts not included in FIG. 36 but in FIG. 37 will be described below.

Specifically, this MOSFET is a modification of the configuration of the foregoing embodiment and is intended to prevent the deterioration of the breakdown voltage at the device terminal of the planar structure. More specifically, as shown in FIG. 37, the outer peripheral portion of each of the buried layers 14, 16 is formed with a buried resurf layer 93. The resurf layer 93, which is substantially square in shape and is formed to surround the buried p-type layers 14, 16 as viewed from the top of the device, has a carrier density lower than the buried p-type layers 14, 16.

In this configuration, the same effects as those in the eighth embodiment are obtained.

(Tenth Embodiment)

Now, a MOSFET according to a tenth embodiment of the invention will be explained.

FIG. 38 is a diagram schematically showing a terminal structure of this MOSFET, in which the same component parts as those in FIG. 6 are designated by the same reference numerals, respectively, as those in FIG. 6 and those component parts substantially identical to those in FIG. 6 with suffix a, respectively. Only those component parts of the embodiment not included in FIG. 6 will be explained below.

Specifically, this MOSFET is a modification of the first embodiment and has a terminal structure in bevel form or by mesa etching. More specifically, as shown in FIG. 38, a bevel structure having an inclination is formed in the device terminal section, and buried p-type layers 14a, 16a at the terminal section of the device are formed substantially in square frame to surround the striped section or the meshy section.

As a consequence, this terminal structure, in addition to the advantage of a bevel structure relaxing the electric field at the pn junction terminals, has the advantage that the frame shape of the buried p-type layers 14a, 16a at the terminal section can determine the potential at the terminal section and thereby improve the operating reliability.

(11th Embodiment)

Now, a MOSFET according to an 11th embodiment of the invention will be explained.

FIG. 39 is a diagram schematically showing a terminal structure of a MOSFET according to this embodiment. In FIG. 39, the same component parts as those in FIG. 38 are designated by the same reference numerals, respectively, and will not be described in detail. Only those component parts not included in FIG. 38 but in FIG. 39 will be described.

Specifically, this MOSFET is a modification of the tenth embodiment and has buried p-type layers 14a, 16a reshaped as a terminal structure in bevel form or by mesa etching. More specifically, as shown in FIG. 39, a striped section or a mesh section is formed extending to the device terminal section in place of the frame section of the buried p-type layers 14a, 16a.

Consequently, this terminal structure, in addition to the advantage of relaxing the electric field in the surfaces of the pn junction, has the advantage that the need of positioning the mask pattern for the buried p-type layers 14, 16 is eliminated for lack of the frame shape of the buried p-type layers 14, 16.

(12th Embodiment)

Now, a MOSFET according to a 12th embodiment of the invention will be explained.

Figure 40:
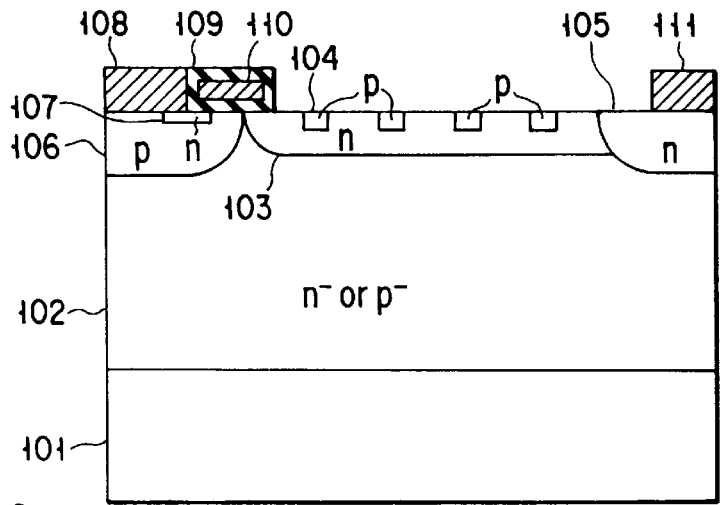
FIG. 40 is a diagram schematically showing a configuration of a MOSFET according to a 12th embodiment of the invention.
Figure 41:
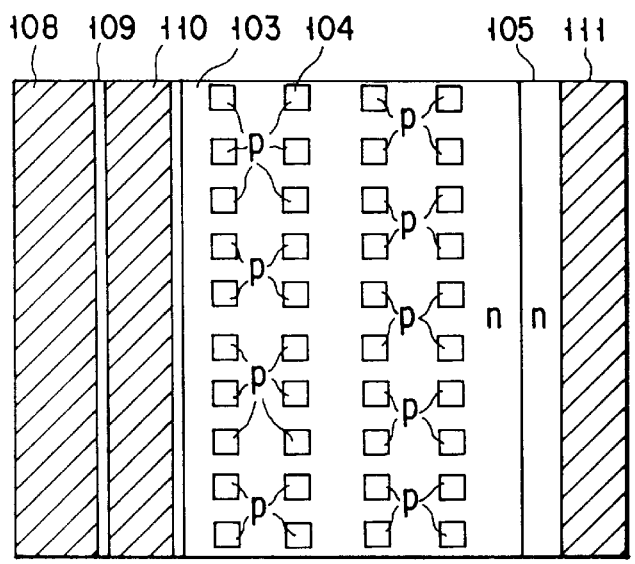
FIG. 41 is a plan view of a MOSFET according to the same embodiment.
Figure 42:
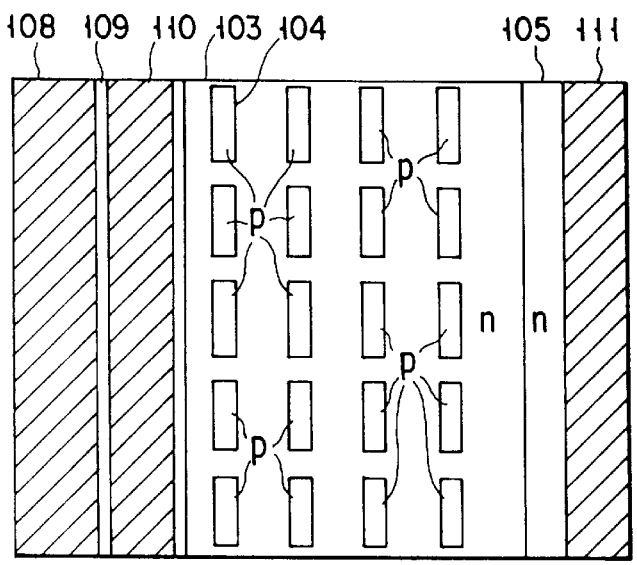
FIG. 42 is a plan view showing a modified configuration of a MOSFET according to the same embodiment.

FIG. 40 is a sectional view schematically showing a configuration of this MOSFET, and FIG. 41 is a plan view of the MOSFET. This MOSFET comprises a n⁻-type layer (or a p⁻-type layer) 102 formed on a substrate 101 and an n-type offset layer 103 formed selectively on the n⁻-type layer 102. The n-type offset layer 103 has the total amount of impurities (dosage) of $1 \times 10^{12}$ cm$^{-2}$ or more. The surface of the n-type offset layer 103 is formed selectively with an n-type drain layer 105 to such a depth as to reach the n⁻-type layer 102 and also selectively with a plurality of buried p-type layers 104 in dots. The buried p-type layers 104, as shown in FIG. 42, may be in striped form. Also, the dotted (or striped) pattern of the buried p-type layers 104 may be irregular unlike the corresponding pattern in FIG. 42 (or FIG. 41).

Further, the surface of the n⁻-layer 102 is formed selectively with a p-type base layer 106 in contact with the n-type offset layer 103, and the surface of the p-type base layer 106 is formed selectively with an n-type source layer 107.

A source electrode 108 is selectively formed on the p-type base layer 106 and the n-type source layer 107. A gate electrode 110 is selectively formed through an oxide film 109 on the n-type source layer 107, the p-type base layer 106 and the n-type offset layer 103.

A drain electrode 111 is formed selectively on the n-type drain layer 105.

By forming the buried p-type layers 104 in the surface of the n-type offset layer 103, the amount of impurities can be increased in the n-type offset layer 103 in the same manner as described above, and therefore the on-resistance can be reduced.

(13th Embodiment)

Now, a MOSFET according to a 13th embodiment of the invention will be explained.

FIG. 43 is a diagram schematically showing a configuration of a MOSFET according to this embodiment. In FIG. 43, the same component parts as those in FIG. 40 are designated by the same reference numerals, respectively, and will not be described in detail. Only those component parts in FIG. 43 which are not included in the configuration of FIG. 40 will be explained below.

Specifically, this MOSFET has a configuration which is a modification of the 12th embodiment. More specifically, as shown in FIG. 43, buried p-type layers 112 are selectively formed in place of the buried p-type layers 104 to the same depth as the p-type source layer 106 in the surface of the n-type offset layer 103.

The buried p-type layers 112 can be formed by trenches (such as circular holes) is formed by RIE or the like process in the mask formed on the n-type offset layer 103 and doping a p-type dopant into the n-type offset layer 103 and the n⁻-type layer 102 through the trenches by ion implantation or the like method and then by removing the mask. Alternatively, trenches having such a depth as to reach the n⁻-type layer 102 are formed in the surface of the n-type offset layer 103, and a p-type polycrystal is buried in the trenches.

This configuration can produce the same effects as the 12th embodiment.

(14th Embodiment)

Now, a MOSFET according to a 14th embodiment will be explained.

FIG. 44 is a diagram schematically showing a configuration of a MOSFET according to this embodiment. This MOSFET uses a SOI (silicon-on-insulator) substrate, and comprises a buried oxide film 122 and an n-type offset layer 123 of Si sequentially formed on a substrate 121.

The n-type offset layer 123 has the dosage of $1 \times 10^{12}$ cm$^{-2}$ or more, and the surface thereof is formed selectively with a p-type base layer 124 and an n-type drain layer 125. The p-type base layer 124 has the surface thereof selectively formed with an n-type source layer 126. Also, the n-type offset layer 123 is selectively formed with buried p-type layers 127 in the form of, say, circular holes in such a manner as to reach the buried oxide film 122 from the surface between the p-type base layer 124 and the n-type drain layer 125.

A source electrode 128 is formed selectively on the p-type base layer 124 and the n-type source layer 126. A gate electrode 130 is formed selectively through the oxide film 129 on the n-type source layer 126, the p-type base layer 124 and the n-type offset layer 123.

The n-type drain layer 125 is formed selectively with a drain electrode 131.

This configuration can also produce the same effects as the 12th and 13th embodiments.

(15th Embodiment)

Now, a MOSFET according to a 15th embodiment will be explained.

FIG. 45 is a diagram schematically showing a configuration of a MOSFET according to this embodiment, and FIG. 46 is a sectional view taken in line XLVI—XLVI in FIG. 45. In FIGS. 45 and 46, the component parts identical to those in FIG. 40 are designated by the same reference numerals, respectively, and will not be described in detail. Only those component parts in FIGS. 45 and 46 which are not included in the configuration of FIG. 40 will be described.

Specifically, this MOSFET is a modification of the 12th embodiment and is intended to prevent the deterioration of the breakdown voltage due to the variations of the fabrication processes. More specifically, as shown in FIGS. 45 and 46, an insulating film 141 is formed on the n-type offset layer 103, the buried p-type layers 104 and the n-type drain layer 105. A plurality of contact holes 142 are formed to reach the buried p-type layers 104 in the surface of the insulating film 141. Four equipotential electrodes 143 are thus formed to interconnect the buried p-type layers 104 equidistantly from the gate electrode.

The four equipotential electrodes 143 each have a larger width than the diameter of each contact hole 142. The portion projecting from the diameter toward the drain electrode 111 constitutes what is called a field plate structure.

As a result, the equipotential electrodes 143 cause each buried p-type layer 104 equidistant from the gate electrode 110 to be connected equipotentially thereby to prevent the deterioration of the breakdown voltage which otherwise might occur due to variations in the fabrication processes. At the same time, the field plate structure of the equipotential electrodes 143 prevents the electric field to be concentrated in the buried p-type layers 104 for an improved breakdown voltage.

(16th Embodiment)

Now, a MOSFET according to a 16th embodiment will be explained.

FIG. 47 is a diagram schematically showing a configuration of a MOSFET according to this embodiment. In FIG. 47, the same component parts as those in FIG. 45 are designated by the same reference numerals, respectively, and will not be described in detail. Only those component parts included in FIG. 47 but not in FIG. 45 will be described below.

Specifically, this MOSFET is a modification of the 15th embodiment and is intended to reduce the resistance RJFET due to the buried p-type layers. More specifically, as shown in FIG. 47, the buried p-type layer 104s in the n-type offset layer 103 are omitted, and an insulating film 141 is formed on the n-type offset layer 103 and the n-type drain layer 105. A plurality of contact holes 142 are formed in dots (or in stripes like in FIG. 42) in the surface of the insulating film 141 in such a depth as to reach the n-type offset layer 103. A plurality of buried p-type layers 144 are formed by the p-type polycrystal buried in the contact holes 142. In the same manner as described above, four p-type connection layers 145 are formed to interconnect the buried p-type layers 144 equidistantly from the gate electrode 110.

The four p-type connection layers 145 are formed to constitute a field plate structure in the same manner as described above.

As a consequence, in addition to the effects of the 15th embodiment, this embodiment has the advantage that the resistance RJFET due to the buried p-type layers 144 can be reduced since the n-type offset layer 103 is formed with the buried p-type layers 144.

(17th Embodiment)

Now, a MOSFET according to a 17th embodiment will be explained.

FIG. 48 is a diagram schematically showing a configuration of a MOSFET according to the 17th embodiment. In FIG. 48, the same component parts as those in FIG. 45 are designated by the same reference numerals, respectively, and will not be described in detail. Only those component parts not included in the configuration of FIG. 45 will be described below.

Specifically, this MOSFET is a modification of the 12th embodiment and is intended to fix the potential of each buried p-type layer 104 using a resistance film made of such a material as SIPOS (semi-insulating polycrytalline silicon).

A MOSFET according to this embodiment is concerned with the state in which the electrode is connected through a high-resistance film such as of SIPOS.

Specifically, this MOSFET, as shown in FIG. 48, the insulating film 141 is formed on the n-type offset layer 103, the buried p-type layers 104 and the n-type drain layer 105. The surface of the insulating layer 141 is formed with a plurality of contact holes 142 in such a depth as to reach buried p-type layers 104. The insulating film 141 is formed with a plurality of SIPOS sections 146 extending from the gate electrode 110 toward the drain electrode 111 to connect the buried p-type layers 104 to each other and also to connect each buried p-type layer 104 to the electrodes 110, 111.

As a result, the electrical resistance of the SIPOS sections 146 causes the voltage between the gate electrode 110 and the drain electrode 111 to be distributed among the buried p-type layers 104. The potential of each buried p-type layer 104 is thus fixed thereby to improve the breakdown voltage.

(18th Embodiment)

Now, a MOSFET according to an 18th embodiment will be explained.

Figure 49:
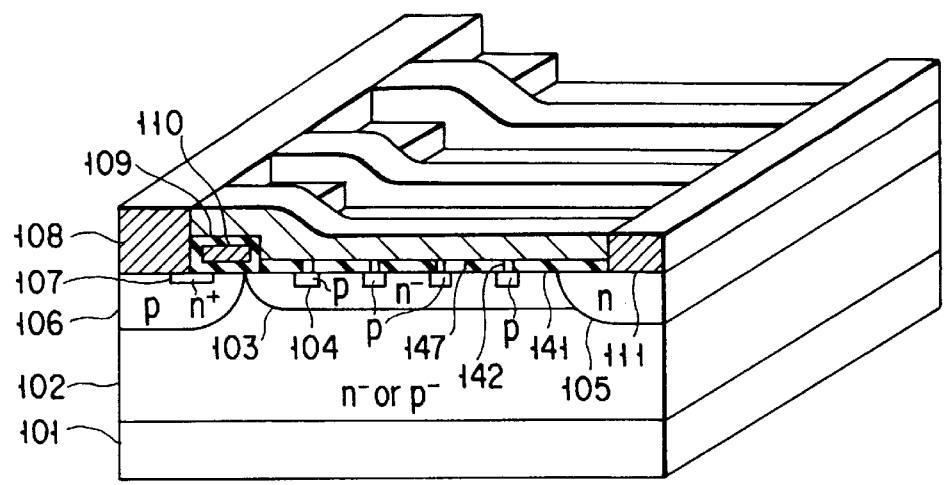
FIG. 49 is a diagram schematically showing a configuration of a MOSFET according to an 18th embodiment of the invention.

FIG. 49 is a diagram schematically showing a configuration of a MOSFET according to this embodiment. In FIG. 49, the same component parts as those in FIG. 45 are designated by the same reference numerals, respectively, and will not be described in detail. Only those component parts not included in FIG. 45 will be described below.

Specifically, this MOSFET is a modification of the 12th or 17th embodiment and is intended to fix the potential of each buried p-type layer using a resistance film such as of SIPOS.

More specifically, as shown in FIG. 49, an insulating film 141 is formed on the n-type offset layer 103, the buried p-type layers 104 and the n-type drain layer 105. The surface of the insulating film 141 is formed with a plurality of SIPOS sections 147 extending from the source electrode 108 toward the drain electrode 111 in a manner to connect the buried p-type layers 104 to each other and also to connect the two electrodes 108, 111.

As a consequence, the electrical resistance of the SIPOS sections 147 causes the voltage between the source electrode 108 and the drain electrode 111 to be shared among the buried p-type layers 104. The potential of each buried p-type layer 104 is thus fixed for an improved breakdown voltage.

(19th Embodiment)

Now, a MOSFET according to a 19th embodiment will be explained.

Figure 50:
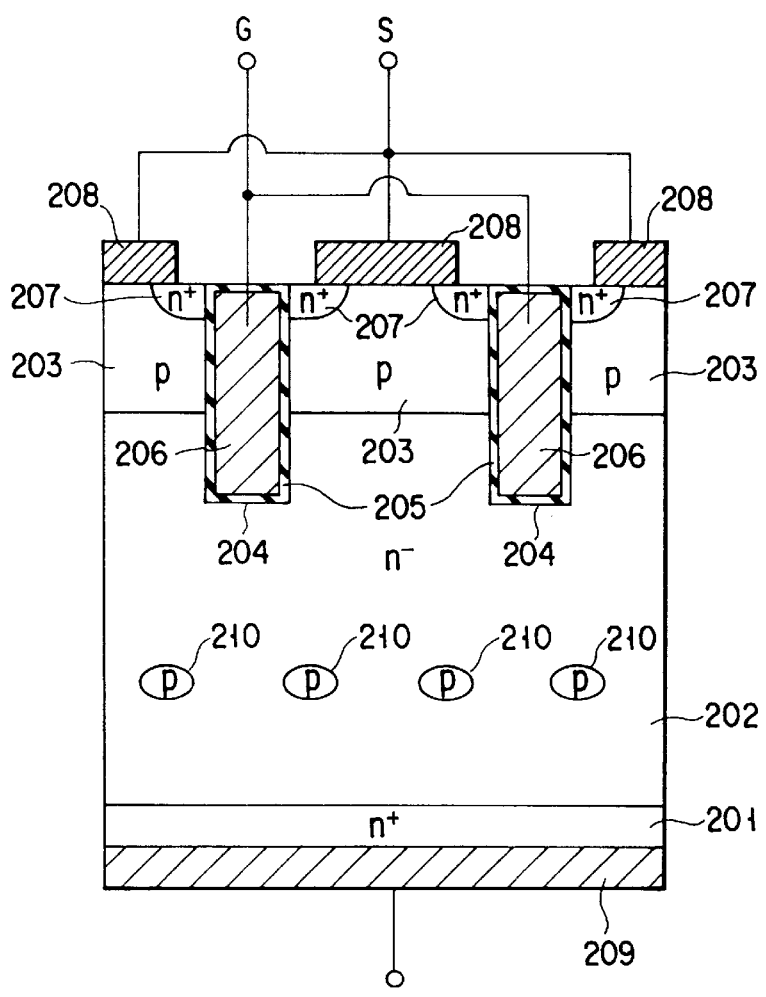
FIG. 50 is a diagram schematically showing a configuration of a MOSFET according to a 19th embodiment of the invention.

FIG. 50 is a sectional view schematically showing a configuration of a MOSFET according to this embodiment. In this MOSFET, an n-type base layer 202 is formed on an n-type substrate 201 constituting an n-type drain layer. A plurality of striped buried p-type layers 210 are formed in the n-type base layer 202. Also, the surface of the n-type base layer 202 is formed with a p-type base layer 203. A plurality of trenches 204 passing through the p-type base layer 203 are formed through the n-type base layer 202 and the p-type base layer 203 in such a depth as to reach halfway to the n-type base layer 202. A gate electrode 206 is buried in each of the trenches 204 through a gate insulating film 205.

A n-type source layer 207 is formed in contact with the upper part of each of the trenches 204 in the surface of the p-type base layer 203. Source electrodes 208 are formed to contact both the p-type base layer 203 and the n-type source layers 207. Also, the surface of the n-type substrate 201 far from the n-type base layer 202 is formed with a drain electrode 209.

The buried p-type layers 210 have a plurality of p-type striped regions connected to each other at the terminal sections thereof in the same manner as described above.

Now, the operation of this MOSFET will be described.

First, reference is made to the on state of the MOSFET.

Now, assume that each gate electrode 206 is positively biased while a voltage positive with respect to the source electrode 208 is applied to the drain electrode 209. The positive biasing of the gate electrode 206 causes the portion of the p-type base layer 203 in contact with the trenches 204 to be formed with an n-type inversion layer. As a result, electrons flow from the n-type source layers 207 to the n-type base layer 202 through the inversion layer, thereby turning on the MOSFET.

Now, the off state of the MOSFET will be explained.

Assume that a voltage positive with respect to the source electrode 208 is applied to the drain electrode 209 with the gate electrode 206 biased to zero or negatively.

In the process, the depletion layer expands in the n-type base layer 202 from the p-type base layer 203 toward the drain electrode 209, so that a point of strongest electric field point occurs in each n-type base layer 202 held between the trenches 204.

Further, with the increase in the source-drain voltage, the depletion layer reaches the buried p-type layers 210. The buried p-type layers 210 thus are punched through and the potential thereof is fixed.

Furthermore, the increase in source-drain voltage expands the depletion layer from the buried p-type layers 210 toward the drain electrode 209. As a result, the electric field at the strongest electric field point in the n-type base layer 202 is fixed and prevented from increasing.

The breakdown voltage of the semiconductor device can be improved and the resistance thereof reduced by designing the distance between the buried p-type layer 210 and the trenches 204 and the impurities concentration of the n-type base layer 202 in such a way that the critical value of the electric field intensity of the n-type base layer 202 is not exceeded by the electric field intensity at the strongest electric field point.

A still higher breakdown voltage can be attained with a still lower resistance by depositing a plurality of buried p-type layers 210 in the n-type base layer 202.

(20th Embodiment)

Figure 51:
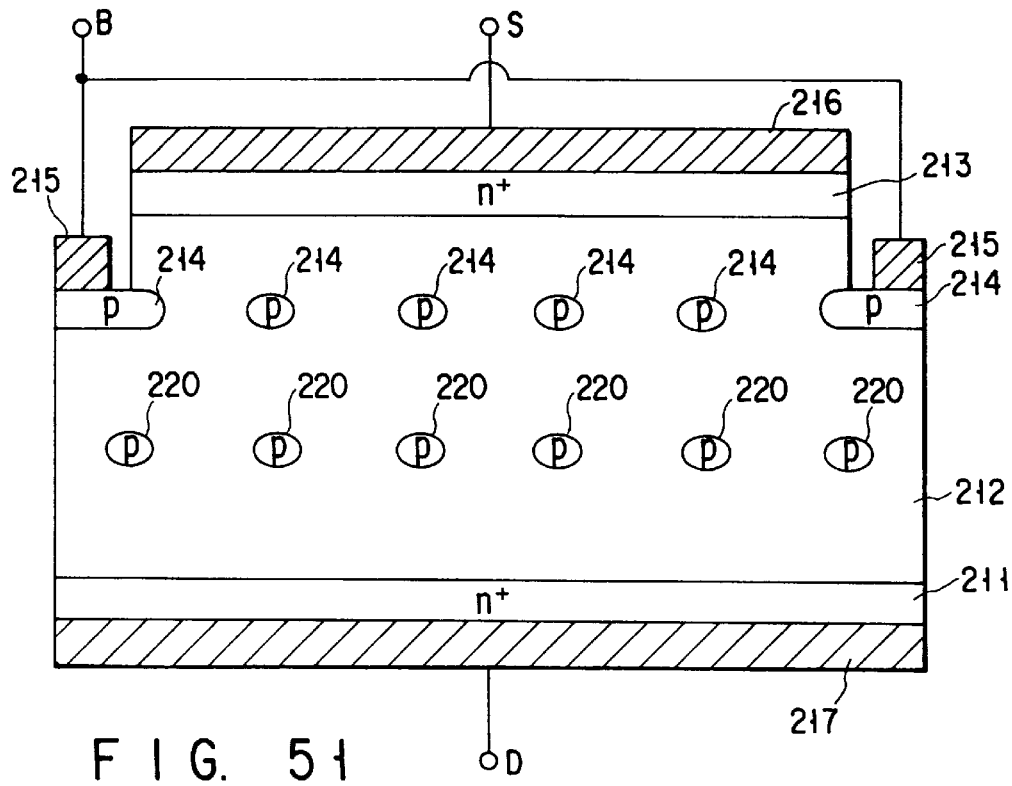
FIG. 51 is a diagram schematically showing a configuration of a semiconductor device according to a 20th embodiment of the invention.

FIG. 51 is a sectional view schematically showing a configuration of a semiconductor device according to a 20th embodiment of the invention. This device is such that an n-type base layer 212 is formed on an n-type substrate 211 making up an n-type drain layer. A plurality of striped buried p-type layers 220 are formed in the n-type base layer 212. Also, the surface of the n-type base layer 212 is formed with an n-type source layer 213. A plurality of p-type base layers 214 are formed by being buried in the n-type base layer 212. The p-type base layers 214 are electrically connected to each other. A base electrode 215 is formed in contact with a p-type base layer 214. Also, the surface of the n-type source layer 213 is formed with a source electrode 216. Further, the surface of the n-type substrate 211 far from the n-type base layer 212 is formed with a drain electrode 217.

Now, the operation of this device will be explained.

Assume that a voltage positive with respect to the source electrode 216 is applied to the drain electrode 217 with the base electrode 215 biased to zero. In the device, electrons flow from the n-type source layer 213 to the n-type drain layer 211 through the path between the p-type base layers 214, and thus the device conducts.

Assume also that the base electrodes 215 are biased positively. Holes are injected from the p-type base layer 214 into the n-type base layer 212, so that the conductive modulation occurs in the vicinity of the p-type base layers 214 thereby to reduce the resistance of the device.

Suppose, on the other hand, that a voltage positive with respect to the source electrode 216 is applied to the drain electrode 217 with the device in off state, i.e., with the base electrode 215 negatively biased. With the base electrode 215 negatively biased. The depletion layer expands from each p-type base layer 214 into the n-type base layer. The two depletion layers come into contact with each other to shut off the current path. Further, the depletion layers expand toward the drain electrode 217, thereby creating the strongest electric field intensity point just under each p-type base layer 214.

Furthermore, with the increase in source-drain voltage, the depletion layers reach the buried p-type layers 220. At this time, the buried p-type layers 220 are punched through and the potential thereof is fixed. In addition, the increase in source-drain voltage expands the depletion layers from the buried layers 220 toward the drain electrode. As a result, the electric field at the strongest electric field intensity point in the n-type base layer 212 is fixed and prevented from increasing.

The breakdown voltage of the semiconductor device according to this embodiment can be improved and the resistance thereof can be reduced by designing the distance between the buried p-type layers 220 and the p-type base layers 214 and the impurities concentration of the n-type base layer 212 in such a manner that the critical value of the strongest electric field intensity of the n-type base layer 212 is not exceeded by the electric field at the strongest electric field intensity point.

A still higher breakdown voltage and a still lower resistance can be achieved by depositing a plurality of buried p-type layers 220 in the n-type base layer 212.

(21st Embodiment)

Figure 52:
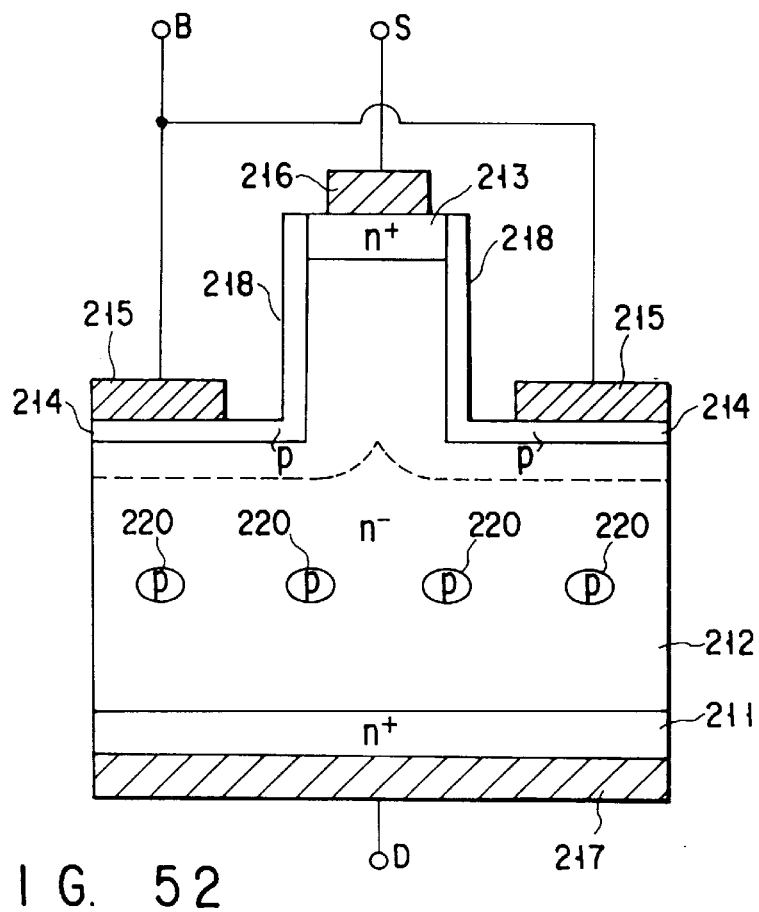
FIG. 52 is a diagram schematically showing a configuration of a semiconductor device according to a 21st embodiment of the invention.

FIG. 52 is a sectional view schematically showing a configuration of a semiconductor device according to a 21st embodiment of the invention. In FIG. 52, the component parts identical to those in FIG. 51 are designated by the same reference numerals, respectively, and will not be described in detail. Only those component parts not included in the configuration of FIG. 51 will be described below.

Specifically, this semiconductor device is a modification of the device of the 20th embodiment, and is intended to improve the accuracy of turn-off operation. More specifically, a trench 218 is formed in such a size as to reach halfway to the n-type base layer 212. A p-type base layer 214 is formed over the side walls and bottom of the trench 218.

As a result, when the device is in off state with the base electrode 215 negatively biased, the portion in contact with a depletion layer extending from each p-type base layer 214 becomes flat as shown by dashed line and therefore the current path can be accurately shut off.

(22nd Embodiment)

FIG. 53 is a sectional perspective view schematically showing a configuration of a semiconductor device according to a 22nd embodiment of the invention. In this semiconductor device, an n-type base layer 222 is formed on an n-type substrate 221 constituting an n-type drain layer. A striped buried p-type layer 230 is formed in the n-type base layer 222. Also, a plurality of striped trenches are formed in the n-type base layer 222 in such a size as to reach halfway to the n-type base layer 222. A p-type polysilicon electrode 226 is formed by being buried in each of the trenches 224 through an insulating film 225. Also, an n-type source layer 227 is formed selectively in the surface of the n-type base layer 222 in such a position as to contact the upper part of the trenches 224. A source electrode 228 is formed in contact with the p-type polysilicon electrode 226 and the n-type source layer 227.

Further, the surface of the n-type base layer 222 in the vicinity of the end of the trenches 224 is formed by diffusion with a p-type base layer 223 deeper than the trenches 224. The surface of the p-type base layer 223 is formed with a base electrode 229. Also, the surface of the n-type substrate 221 far from the n-type base layer 222 is formed with a drain electrode 231.

Now, the operation of this semiconductor device will be explained.

Assume that the base electrode 229 is positively biased while a voltage positive with respect to the source electrodes 227 is applied to the drain electrode 231. Holes are injected into the n-type base layer 222 from the p-type base layer 223, while at the same time flowing toward the n-type source layer 227 along the insulating film 225. Electrons, on the other hand, are injected into the n-type base layer 222 from the n-type source layer 227 in accordance with the amount of the holes that have flowed in. The electrons are attracted by the voltage applied between the source and drain and flow toward the drain electrode 231. As a result, the semiconductor device conducts. In the process, the injection of holes from the p-type base layer 223 causes a conductive modulation in the n-type base layer 222, thereby further reducing the resistance.

Assume again that a voltage positive with respect to the source electrode 228 is applied to the drain electrode 231 with the semiconductor device in off state, i.e., with the base electrode 229 biased to zero.

At this time, the difference in diffusion potential between the n-type base layer 222 and the p-type polysilicon electrode 226 causes the depletion layers to expand from the trenches 224 so that the depletion layers come into contact with each other. Also, since a depletion layer also expands from the p-type base layer 223, the current path is shut off. Further, the depletion layers expand toward the drain electrode 231, and the strongest electric field intensity point occurs just under the p-type base electrode 232.

Furthermore, in proportion to the increase in source-drain voltage, the depletion layers reach the buried p-type layers 230. At this time, the buried p-type layers 230 are punched through, and the potential thereof is fixed. With a further increase in source-drain voltage, the depletion layers expand from the buried p-type layers 230 toward the drain electrode 231. As a result, the electric field intensity at the strongest electric field intensity point is fixed and prevented from increasing.

The breakdown voltage of the semiconductor device according to this embodiment can be improved and the resistance thereof reduced further by designing the distance between the buried p-type layers 230 and the p-type base layer 223 and the impurities concentration of the p-type base layer 222 in such a manner that the critical value of the electric field intensity of the n-type base layer 222 is not exceeded by the electric field at the strongest electric field intensity point. A still further improvement in breakdown voltage and a still further reduction of the resistance can be achieved by depositing a plurality of buried p-type layers 230 in the n-type base layer 222.

In the 20th to 22nd embodiments, those n-type base layers 212 (222) separated by the buried p-type layers 220 (230) which are adjacent to the p-type base layer 213 (223) can be decreased in concentration, increased in thickness as compared with the other n-type base layers 212 (222) and increased in the allotted voltage thereby to further reduce the resistance and further improve the breakdown voltage. The reason is that since the neighborhood of the p-type base layers 213 (223) are in high injection state, even the resistance of the high-resistance n-type base layer 212 (222) is held low in on state. Therefore, the voltage allotted to the n-type base layers 212 (222) distant from the p-type base layer 213 (223) is better reduced to reduce the resistance of the device as a whole.

Now, a specific method of designing the buried p-type layers will be explained with reference to FIG. 6.

Suppose the production specification determines the breakdown voltage BV between the source electrodes 22 and the drain electrode 12 and the number M of the buried p-type layers 14, 16 between the source electrodes 22 and the drain electrode 12.

Then, a voltage $V_1$ is determined which is allotted to the n-type base layer 17 in contact with the p-type base layers 18 on the source electrode 22 side, among the n-type base layers 13, 15, 17 separated into M+1 layers by the buried p-type layers 14, 16.

Specifically, first, an allotted voltage Vs is provisionally calculated by equation (1), and then the allotted voltage $V_1$ is determined by formula (10) to a value not less than the provisional allotted voltage Vs.

$$V_1 \geq Vs \qquad (10)$$

Similarly, an allotted voltage $V_2$ can be obtained as follows from formula (10a).

$$V_2 \geq Vs \qquad (10a)$$

Then $V_2$ is a voltage allotted to the n-type base layers 13 in contact with the n-type drain layer 11 among the n-type base layers 13, 15, 17 separated into M+1 layers by the buried p-type layers 14, 16.

In accordance with this determination, the allotted voltage Vs of other part is calculated from formula (11) below. The voltage Vs thus determined of course also satisfies the relation given in formulae (10) and (10a).

$$Vs = V_2 = (BV - V_1 - V_2)/(M-1)[V] \qquad (11)$$

where Vs is the voltage allotted to the n-type base layers 15 in the number of M−1 in contact with neither the p-type base layer 18 nor the n-type (or p-type) drain layer 11 among the n-type base layers 13, 15, 17 separated into M+1 layers by the buried p-type layers 14, 16.

In similar fashion, the impurities concentration $N_1$ and the thickness $W_1$ of the n-type base layer 17 with an allotted voltage $V_1$ are obtained as shown by formulae (12) and (13) below.

$$N_1 < 1.897 \times 10^{18} \times V_1^{-1.35} [cm^{-3}] \qquad (12)$$

$$W_1 < 1.1247 \times 10^{10} \times N_1^{-0.85} [cm] \qquad (13)$$

Similarly, the impurities concentration $N_2$ and the thickness $W_2$ of the n-type base layer 13 with the allotted voltage of $V_2$ can be obtained as follows from formulae (14) and (15).

$$N_2 < 1.897 \times 10^{18} \times V_2^{-1.35} [cm^{-3}] \qquad (14)$$

$$W_2 < 1.1247 \times 10^{10} \times N_2^{-0.85} [cm] \qquad (15)$$

Further, formula (15) is an example, the thickness $W_2$ of the n-type base layer 13 (with the allotted voltage of $V_2$) is not limited to formula (15).

In similar fashion, the impurities concentration Ns and the thickness Ws of the n-type base layer 15 with the allotted voltage of Vs can be obtained as follows from formulae (16) and (17).

$$Ns < 1.897 \times 10^{18} \times Vs^{-1.35} [cm^{-3}] \qquad (16)$$

$$Ws < 1.1247 \times 10^{10} \times Ns^{-0.85} [cm] \qquad (17)$$

As described above, different voltages can be allotted to the n-type base layers 13, 15, 17. Also, since the design conditions are specifically determined as shown by formulae (10) to (17), a device operating accurately can be fabricated with a high reproducibility. Further, the design conditions represented by formulae (10) to (17) are applicable to all the embodiments described above regardless of the planar structure, trench structure, or such device structure as longitudinal or lateral.

Since certain changes may be made in the above device without departing from the scope of the invention herein involved, it is intended that all matter contained in the above description or shown in the accompanying drawings shall be interpreted as illustrative and not in a limiting sense.

What is claimed is:

1. A semiconductor device comprising:

a first main electrode;

a second main electrode;

a high-resistance semiconductor layer of a first conductivity type interposed between said first main electrode and said second main electrode; and a buried layer of a second conductivity type selectively formed in said high-resistance semiconductor layer of the first conductivity type, having a floated potential, and extending at substantially right angles to a line connecting said first and second main electrodes, and comprising a plurality of strips functioning as current paths and set at said floated potential different from a potential of any other electrode when a depletion layer extending from a region near said first main electrode reaches said buried layer of the second conductivity type, wherein the following relations hold:

$$Vs = (BV - V_1 - V_2)/(M-1)V;$$

$$V_1 \geq Vs;$$

$$V_2 \geq Vs;$$

$$N_1 < 1.897 \times 10^{18} \times V_1^{-1.35} \text{cm}^{-3};$$

$$N_2 < 1.897 \times 10^{18} \times V_2^{-1.35} \text{cm}^{-3};$$

$$Ns < 1.897 \times 10^{18} \times Vs^{-1.35} \text{cm}^{-3};$$

$$W_1 < 1.1247 \times 10^{10} \times N_1^{-0.85} \text{cm};$$

$$Ws < 1.1247 \times 10^{10} \times Ns^{-0.85} \text{cm}; \text{ and}$$

where

BV is the breakdown voltage between said first and second main electrodes;

M is the number of said buried layer of the second conductivity type between said first and second main electrodes;

$V_1$ is the voltage allotted to a first region of said high-resistance semiconductor layer of the first conductivity type between said first main electrode and said buried layer of the second conductivity type, said first region being located near said first main electrode;

$N_1$ is the impurities concentration of said first region of said high-resistance semiconductor layer of the first conductivity type;

$W_1$ is the thickness of said first region of said high-resistance semiconductor layer of the first conductivity type;

$V_2$ is the voltage allotted to a second region of said high-resistance semiconductor layer of the first conductivity type between said second main electrode and said buried layer of the second conductivity type, said second region being located near said second main electrode;

$N_2$ is the impurities concentration of said second region of said high-resistance semiconductor layer of the first conductivity type;

Vs is the voltage allotted to a third region of said high-resistance semiconductor layer of the first conductivity type, said third region is between said first and second regions of said high-resistance semiconductor layer of the first conductivity type;

Ns is the impurities concentration of said third region of said high-resistance semiconductor layer of the first conductivity type; and Ws is the thickness of said third region of said high resistance semiconductor layer of the first conductivity type.

2. A semiconductor device comprising:

a first main electrode;

a second main electrode;

a high-resistance semiconductor layer of a first conductivity type interposed between said first main electrode and said second main electrode;

a current control structure formed in contact with said high-resistance semiconductor layer of the first conductivity type and having a control electrode for controlling the current flowing from said first main electrode to said second main electrode; and a buried layer of a second conductivity type selectively formed in said high-resistance semiconductor layer of the first conductivity type, having a floated potential, and extending at substantially right angles to a line connecting said first and second main electrodes and comprising a plurality of strips functioning as current paths, and said plurality of strips are set at a floating potential different from a potential of any other electrode when a depletion layer extending from a region near said first main electrode reaches said buried layer of the second conductivity type, wherein the following relations hold:

$$Vs = (BV - V_1 - V_2)/(M-1)V;$$

$$V_1 \geq Vs;$$

$$V_2 \geq Vs;$$

$$N_1 < 1.897 \times 10^{18} \times V_1^{-1.35} \text{cm}^{-3};$$

$$N_2 < 1.897 \times 10^{18} \times V_2^{-1.35} \text{cm}^{-3};$$

$$Ns < 1.897 \times 10^{18} \times Vs^{-1.35} \text{cm}^{-3};$$

$$W_1 < 1.1247 \times 10^{10} \times N_1^{-0.85} \text{cm};$$

$$Ws < 1.1247 \times 10^{10} \times Ns^{-0.85} \text{cm}; \text{ and}$$

where

BV is the breakdown voltage between said first and second main electrodes;

M is the number of said buried layer of the second conductivity type between said first and second main electrodes;

$V_1$ is the voltage allotted to a first region of said high-resistance semiconductor layer of the first conductivity type between said first main electrode and said buried layer of the second conductivity type, said first region being located near said first main electrode;

$N_1$ is the impurities concentration of said first region of said high-resistance semiconductor layer of the first conductivity type;

$W_1$ is the thickness of said first region of said high-resistance semiconductor layer of the first conductivity type;

$V_2$ is the voltage allotted to a second region of said high-resistance semiconductor layer of the first conductivity type between said second main electrode and said buried layer of the second conductivity type, said second region being located near said second main electrode;

$N_2$ is the impurities concentration of said second region of said high-resistance semiconductor layer of the first conductivity type;

Vs is the voltage allotted to a third region of said high-resistance semiconductor layer of the first conductivity type, said third region is between said first and second regions of said high-resistance semiconductor layer of the first conductivity type;

Ns is the impurities concentration of said third region of said high-resistance semiconductor layer of the first conductivity type; and Ws is the thickness of said third region of said high resistance semiconductor layer of the first conductivity type.

3. A semiconductor device comprising:

a drain layer;

a drain electrode formed on a surface of said drain layer;

a high-resistance semiconductor layer of a first conductivity type formed on a surface of said drain layer, which faces different from said drain electrode;

a base layer of a second conductivity type formed selectively in a surface of said high-resistance semiconductor layer of the first conductivity type, which faces different from said drain layer;

a source layer of the first conductivity type formed selectively in the surface of said base layer of the second conductivity type;

a source electrode formed on said source layer of the first conductivity type and said base layer of the second conductivity type;

a gate electrode in contact with said source layer of the first conductivity type, said base layer of the second conductivity type and said high-resistance semiconductor layer of the first conductivity type through a gate insulating film; and a buried layer of a second conductivity type selectively formed in said high-resistance semiconductor layer of the first conductivity type, having a floated potential, and extending at substantially right angles to a line connecting said drain and source electrodes and comprising a plurality of strips functioning as current paths, and said plurality of strips are set at a floating potential different from a potential of any other electrode when a depletion layer extending from a region near said drain electrode reaches said buried layer of the second conductivity type.

wherein the following relations hold:

$$Vs=(BV-V_1-V_2)/(M-1)V;$$

$$V_1 \geq Vs;$$

$$V_2 \geq Vs;$$

$$N_1 < 1.897 \times 10^{18} \times V_1^{-1.35} \text{cm}^{-3};$$

$$N_2 < 1.897 \times 10^{18} \times V_2^{-1.35} \text{cm}^{-3};$$

$$Ns < 1.897 \times 10^{18} \times Vs^{-1.35} \text{cm}^{-3};$$

$$W_1 < 1.1247 \times 10^{10} \times N_1^{-0.85} \text{cm};$$

$$Ws < 1.1247 \times 10^{10} \times Ns^{-0.85} \text{cm}; \text{ and}$$

where

BV is the breakdown voltage between said source electrode and said drain electrode;

M is the number of said buried layer of the second conductivity type between said source electrode and said drain electrode;

$V_1$ is the voltage allotted to a first region of said high-resistance semiconductor layer of the first conductivity type between said source electrode and said buried layer of the second conductivity type, said first region being located near said source electrode;

$N_1$ is the impurities concentration of said first region of said high-resistance semiconductor layer of the first conductivity type;

$W_1$ is the thickness of said first region of said high-resistance semiconductor layer of the first conductivity type;

$V_2$ is the voltage allotted to a second region of said high-resistance semiconductor layer of the first conductivity type between said drain electrode and said buried layer of the second conductivity type, said second region being located near said drain electrode;

$N_2$ is the impurities concentration of said second region of said high-resistance semiconductor layer of the first conductivity type;

Vs is the voltage allotted to a third region of said high-resistance semiconductor layer of the first conductivity type, said third region is between said first and second regions of said high-resistance semiconductor layer of the first conductivity type;

Ns is the impurities concentration of said third region of said high-resistance semiconductor layer of the first conductivity type; and Ws is the thickness of said third region of said high resistance semiconductor layer of the first conductivity type.

* * * * *